(12) United States Patent
Takeda et al.

(10) Patent No.: US 12,068,049 B2
(45) Date of Patent: *Aug. 20, 2024

(54) MEMORY SYSTEM

(71) Applicant: Kioxia Corporation, Tokyo (JP)

(72) Inventors: Naomi Takeda, Yokohama (JP); Masanobu Shirakawa, Chigasaki (JP)

(73) Assignee: Kioxia Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 18/163,906

(22) Filed: Feb. 3, 2023

(65) Prior Publication Data

US 2023/0187008 A1 Jun. 15, 2023

Related U.S. Application Data

(63) Continuation of application No. 17/349,358, filed on Jun. 16, 2021, now Pat. No. 11,605,440.

(30) Foreign Application Priority Data

Mar. 11, 2021 (JP) ................ 2021-039433

(51) Int. Cl.
*G11C 16/26* (2006.01)
*G11C 16/10* (2006.01)
*G11C 29/18* (2006.01)
*G11C 29/42* (2006.01)
(Continued)

(52) U.S. Cl.
CPC .............. *G11C 29/42* (2013.01); *G11C 29/18* (2013.01); *G11C 29/44* (2013.01); *G11C 2029/1202* (2013.01); *G11C 2029/1204* (2013.01)

(58) Field of Classification Search
CPC ......... G11C 29/42; G11C 29/18; G11C 29/44; G11C 2029/1202; G11C 2029/1204; G11C 2029/0411; G11C 29/021; G11C 29/028; G11C 29/52
See application file for complete search history.

(56) References Cited

U.S. PATENT DOCUMENTS

| | | | |
|---|---|---|---|
| 5,898,637 A | * | 4/1999 | Lakhani ............... G11C 8/10 365/185.23 |
| 8,248,857 B2 | | 8/2012 | Tanaka et al. |
| 10,346,177 B2 | | 7/2019 | Natu et al. |

(Continued)

FOREIGN PATENT DOCUMENTS

| | | |
|---|---|---|
| JP | 2010-244605 A | 10/2010 |
| JP | 2020-47337 A | 3/2020 |

*Primary Examiner* — Hien N Nguyen
(74) *Attorney, Agent, or Firm* — Oblon, McClelland, Maier & Neustadt, L.L.P.

(57) ABSTRACT

According to one embodiment, a non-volatile memory includes a plurality of groups and a memory controller configured to execute a first operation. Each of the plurality of groups includes a plurality of cell units. Each of the plurality of cell units includes a plurality of memory cells. The first operation includes: based on a first correction amount associated with a target group, reading data from the target group; and updating the first correction amount to a second correction amount based on the data. The memory controller is configured to: select a first group as the target group; and when a condition is satisfied, select a second group as the target group after performing the first operation related to the first group.

16 Claims, 28 Drawing Sheets

(51) Int. Cl.
  *G11C 29/44* (2006.01)
  *G11C 29/12* (2006.01)

(56) References Cited

U.S. PATENT DOCUMENTS

| | | |
|---|---|---|
| 10,732,847 B2 * | 8/2020 | Bazarsky ............... G11C 29/52 |
| 11,605,440 B2 * | 3/2023 | Takeda ................... G11C 29/52 |
| 2003/0169630 A1 * | 9/2003 | Hosono ................ G11C 16/105 |
| | | 365/200 |
| 2013/0215682 A1 * | 8/2013 | Yang ...................... G11C 16/06 |
| | | 365/185.29 |
| 2016/0254059 A1 * | 9/2016 | Ochi ...................... G11C 16/26 |
| | | 365/185.22 |
| 2020/0090762 A1 | 3/2020 | Shirakawa et al. |
| 2020/0183610 A1 * | 6/2020 | Seetharaman ......... G11C 16/14 |
| 2020/0301778 A1 * | 9/2020 | Kurose ................. G11C 16/26 |
| 2021/0375372 A1 * | 12/2021 | Sakurada ........... G11C 16/0483 |

* cited by examiner

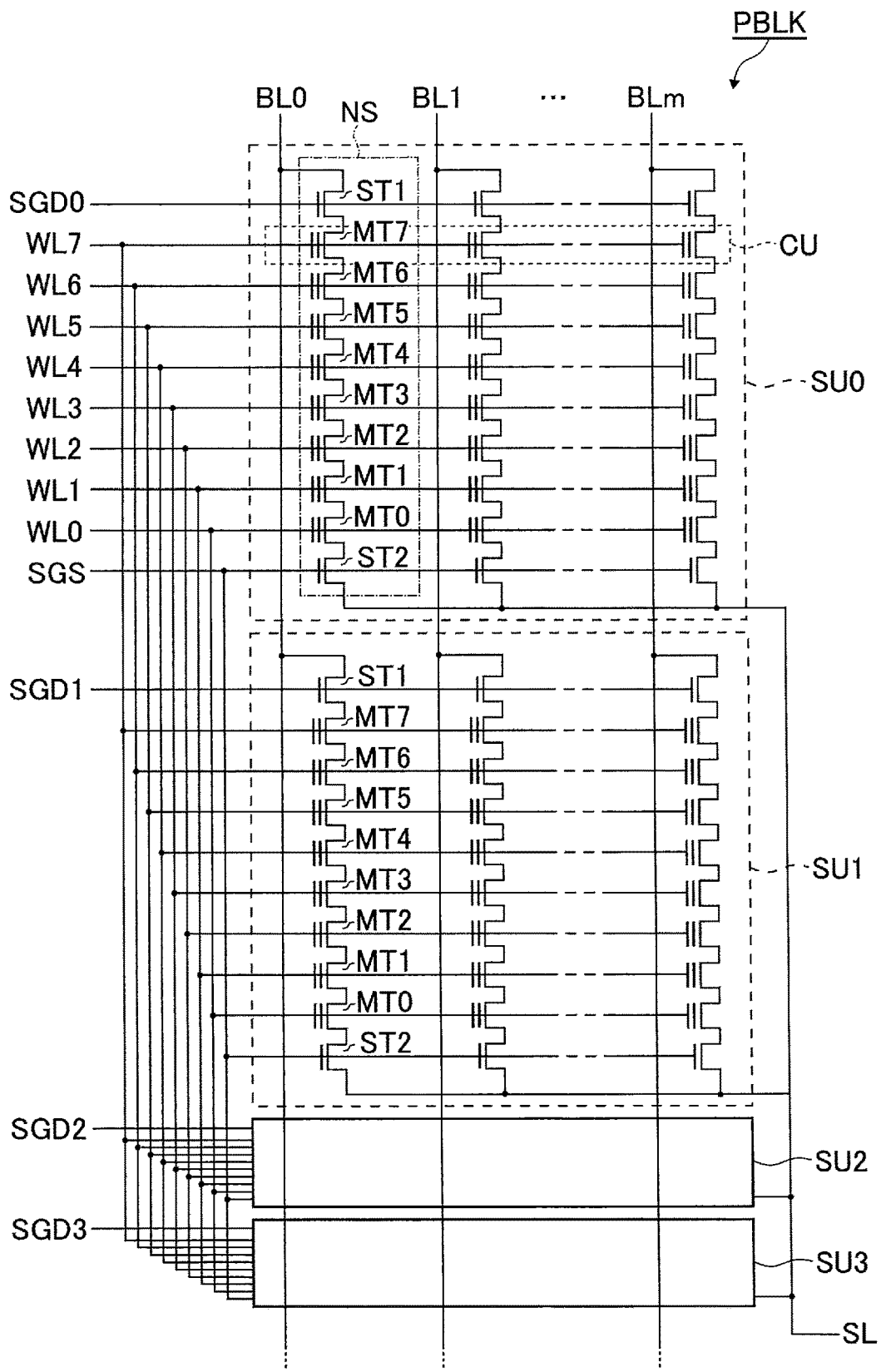
F I G. 4

21

| Chip | Physical block | Representative correction amount $\Delta Va$ | | |
|---|---|---|---|---|
| | | AR | BR | CR |
| CP0 | PBLK0 | $\Delta VA0$ | $\Delta VB0$ | $\Delta VC0$ |
| | PBLK1 | $\Delta VA1$ | $\Delta VB1$ | $\Delta VC1$ |
| | PBLK2 | $\Delta VA2$ | $\Delta VB2$ | $\Delta VC2$ |
| | PBLK3 | $\Delta VA3$ | $\Delta VB3$ | $\Delta VC3$ |
| CP1 | PBLK0 | ⋮ | ⋮ | ⋮ |
| | PBLK1 | ⋮ | ⋮ | ⋮ |
| | PBLK2 | ⋮ | ⋮ | ⋮ |
| | PBLK3 | ⋮ | ⋮ | ⋮ |
| ⋮ | ⋮ | ⋮ | ⋮ | ⋮ |

F I G. 6

| Chip | Physical block | Valid flag |
|---|---|---|
| CP0 | PBLK0 | true |
|  | PBLK1 | false |
|  | PBLK2 | true |
|  | PBLK3 | false |
| CP1 | PBLK0 | ⋮ |
|  | PBLK1 | ⋮ |
|  | PBLK2 | ⋮ |
|  | PBLK3 | ⋮ |
| ⋮ | ⋮ | ⋮ |

F I G. 8

22

| Chip | Physical block | Valid flag | Number of remaining read operations |
|---|---|---|---|
| CP 0 | PBLK0 | true | 0 |
| | PBLK1 | false | 0 |
| | PBLK2 | true | 1 |
| | PBLK3 | false | 0 |
| CP 1 | PBLK0 | ⋮ | ⋮ |
| | PBLK1 | ⋮ | ⋮ |
| | PBLK2 | ⋮ | ⋮ |
| | PBLK3 | ⋮ | ⋮ |
| ⋮ | ⋮ | ⋮ | ⋮ |

F I G. 13

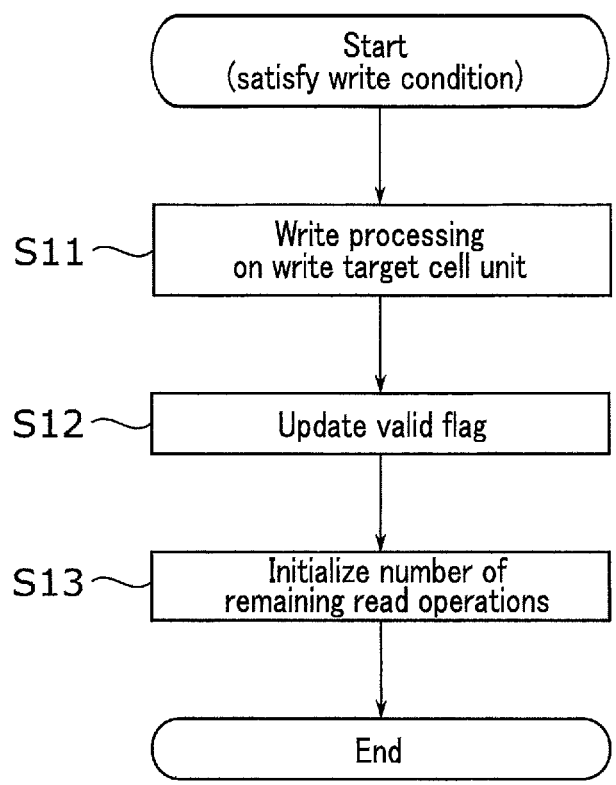
F I G. 14

22

| Chip | Physical block | Valid flag | Designated address |
|---|---|---|---|
| CP0 | PBLK0 | true | <2,0,U> |
| | PBLK1 | false | <5,2,L> |
| | PBLK2 | true | <0,3,L> |
| | PBLK3 | false | <7,1,U> |
| CP1 | PBLK0 | ⋮ | ⋮ |
| | PBLK1 | ⋮ | ⋮ |
| | PBLK2 | ⋮ | ⋮ |
| | PBLK3 | ⋮ | ⋮ |
| ⋮ | ⋮ | ⋮ | ⋮ |

F I G. 16

|  |  | SU0 | SU1 | SU2 | SU3 |
|---|---|---|---|---|---|
| WL7 | Upper | 61 | 62 | 63 | 64 |
|  | Lower | 29 | 30 | 31 | 32 |
| WL6 | Upper | 57 | 58 | 59 | 60 |
|  | Lower | 25 | 26 | 27 | 28 |
| WL5 | Upper | 53 | 54 | 55 | 56 |
|  | Lower | 21 | 22 | 23 | 24 |
| WL4 | Upper | 49 | 50 | 51 | 52 |
|  | Lower | 17 | 18 | 19 | 20 |
| WL3 | Upper | 45 | 46 | 47 | 48 |
|  | Lower | 13 | 14 | 15 | 16 |
| WL2 | Upper | 41 | 42 | 43 | 44 |
|  | Lower | 9 | 10 | 11 | 12 |
| WL1 | Upper | 37 | 38 | 39 | 40 |
|  | Lower | 5 | 6 | 7 | 8 |
| WL0 | Upper | 33 | 34 | 35 | 36 |
|  | Lower | 1 | 2 | 3 | 4 |

| Logical block | Valid flag | Designated address |
|---|---|---|
| LBLK0 | true | PBLK0: of CP0 <2,0,U> |
| | | PBLK0: of CP1 <2,0,L> |
| LBLK1 | false | PBLK1: of CP0 <5,2,L> |
| | | PBLK1: of CP1 <5,2,U> |
| LBLK2 | true | PBLK2: of CP0 <0,3,L> |
| | | PBLK2: of CP1 <0,3,U> |
| LBLK3 | false | PBLK3: of CP0 <7,1,U> |
| | | PBLK3: of CP1 <7,1,L> |
| ⋮ | ⋮ | ⋮ |

F I G. 20

|  |  | SU0 | SU1 | SU2 | SU3 |
|---|---|---|---|---|---|
| WL7 | Upper | 61 | 62 | 63 | 64 |
|  | Lower | 29 | 30 | 31 | 32 |
| WL6 | Upper | 57 | 58 | 59 | 60 |
|  | Lower | 25 | 26 | 27 | 28 |
| WL5 | Upper | 53 | 54 | 55 | 56 |
|  | Lower | 21 | 22 | 23 | 24 |
| WL4 | Upper | 49 | 50 | 51 | 52 |
|  | Lower | 17 | 18 | 19 | 20 |
| WL3 | Upper | 45 | 46 | 47 | 48 |
|  | Lower | 13 | 14 | 15 | 16 |
| WL2 | Upper | 41 | 42 | 43 | 44 |
|  | Lower | 9 | 10 | 11 | 12 |
| WL1 | Upper | 37 | 38 | 39 | 40 |
|  | Lower | 5 | 6 | 7 | 8 |
| WL0 | Upper | 33 | 34 | 35 | 36 |
|  | Lower | 1 | 2 | 3 | 4 |

F I G. 21

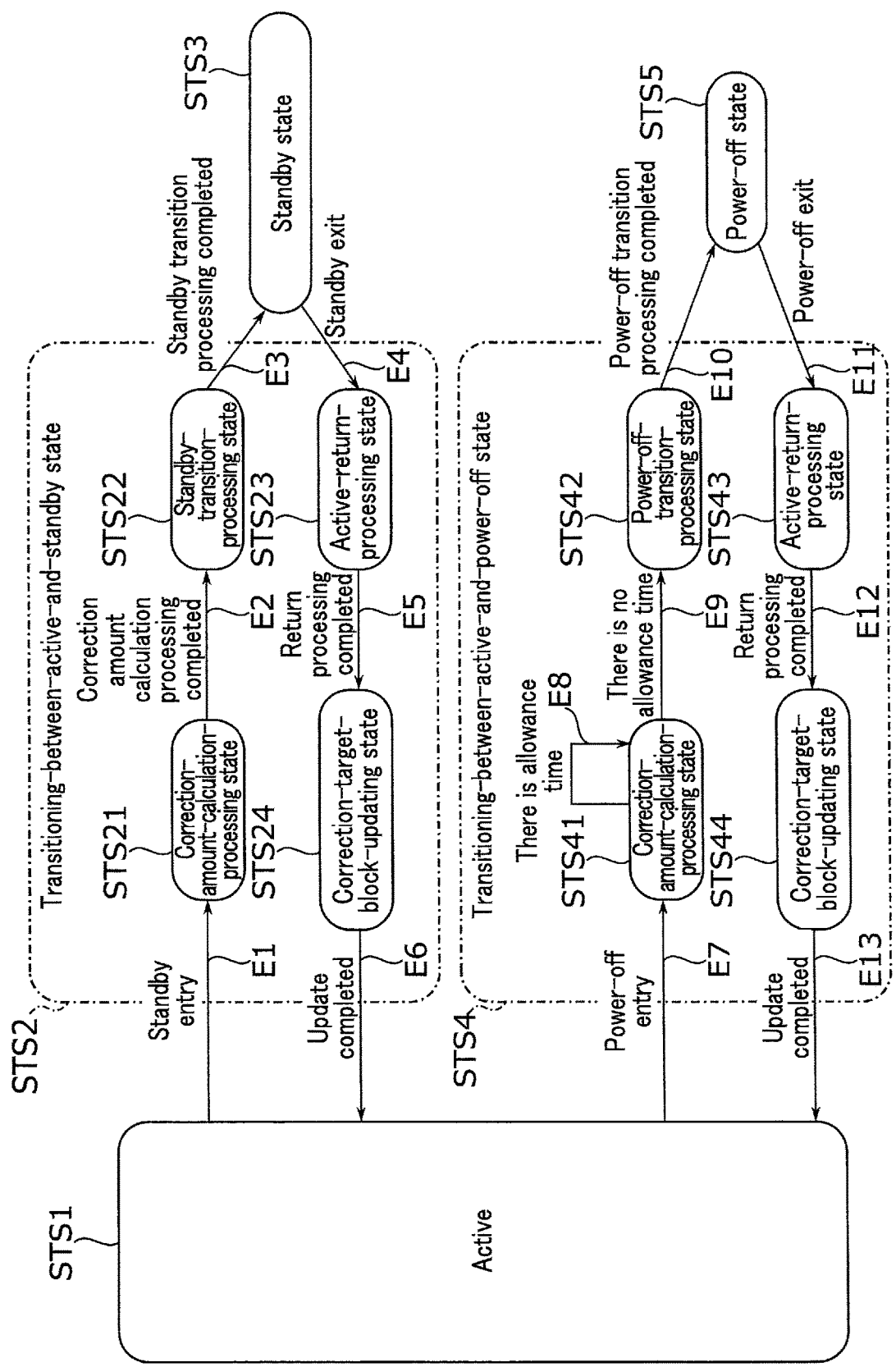
F I G. 23

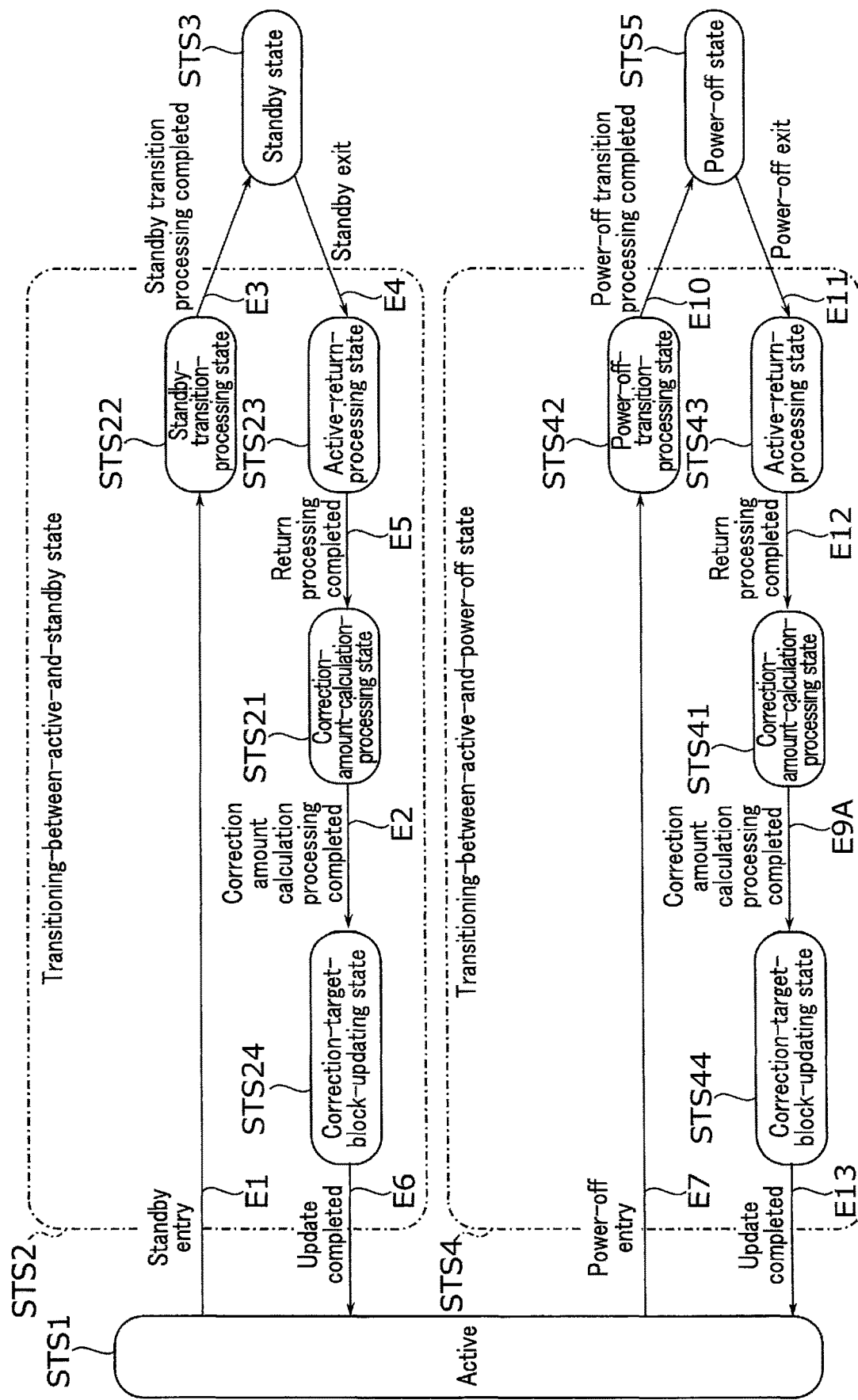
F I G. 24

22

(A): Not-written list

| Chip | Physical block | Valid flag | Number of corrections |
|---|---|---|---|
| CP0 | PBLK1 | false | 0 |
| CP0 | PBLK3 | false | 0 |
| ⋮ | ⋮ | ⋮ | ⋮ |

(B): Uncorrected list

High-frequency correction target block

| Chip | Physical block | Valid flag | Number of corrections | |
|---|---|---|---|---|
| CP0 | PBLK2 | true | 0 | ← ptr1 |
| CP1 | PBLK1 | true | 0 | |
| CP1 | PBLK3 | true | 0 | |
| ⋮ | ⋮ | ⋮ | ⋮ | |

(C): Small-number-of-corrections list

Intermediate-frequency correction target block

| Chip | Physical block | Valid flag | Number of corrections | |
|---|---|---|---|---|
| CP0 | PBLK3 | true | 2 | ← ptr2 |
| CP1 | PBLK2 | true | 1 | |
| ⋮ | ⋮ | ⋮ | ⋮ | |

(D): Large-number-of-corrections list

Low-frequency correction target block

| Chip | Physical block | Valid flag | Number of corrections | |
|---|---|---|---|---|
| CP1 | PBLK0 | false | 5 | ← ptr3 |
| ⋮ | ⋮ | ⋮ | ⋮ | |

F I G. 25

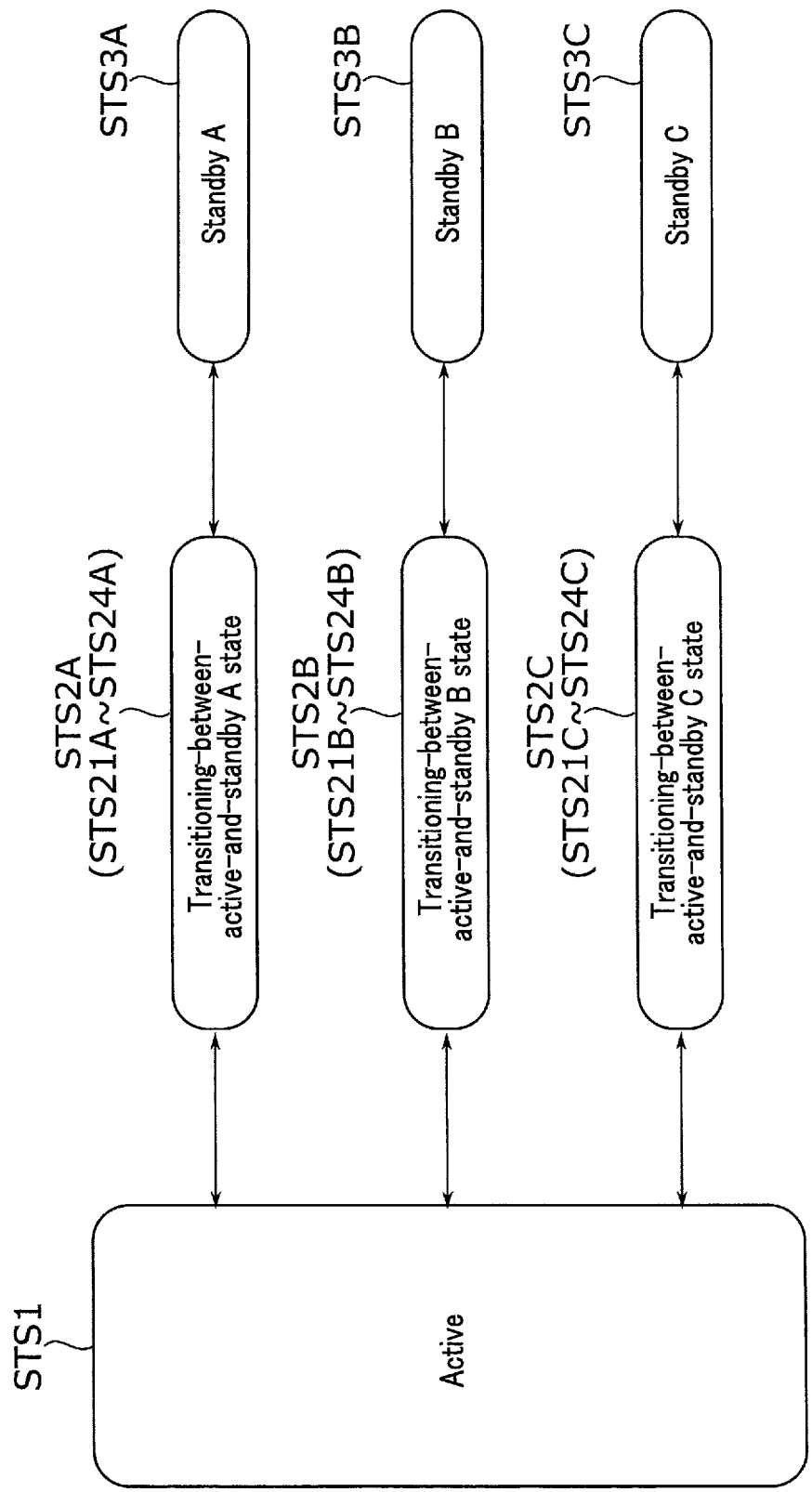
F I G. 27

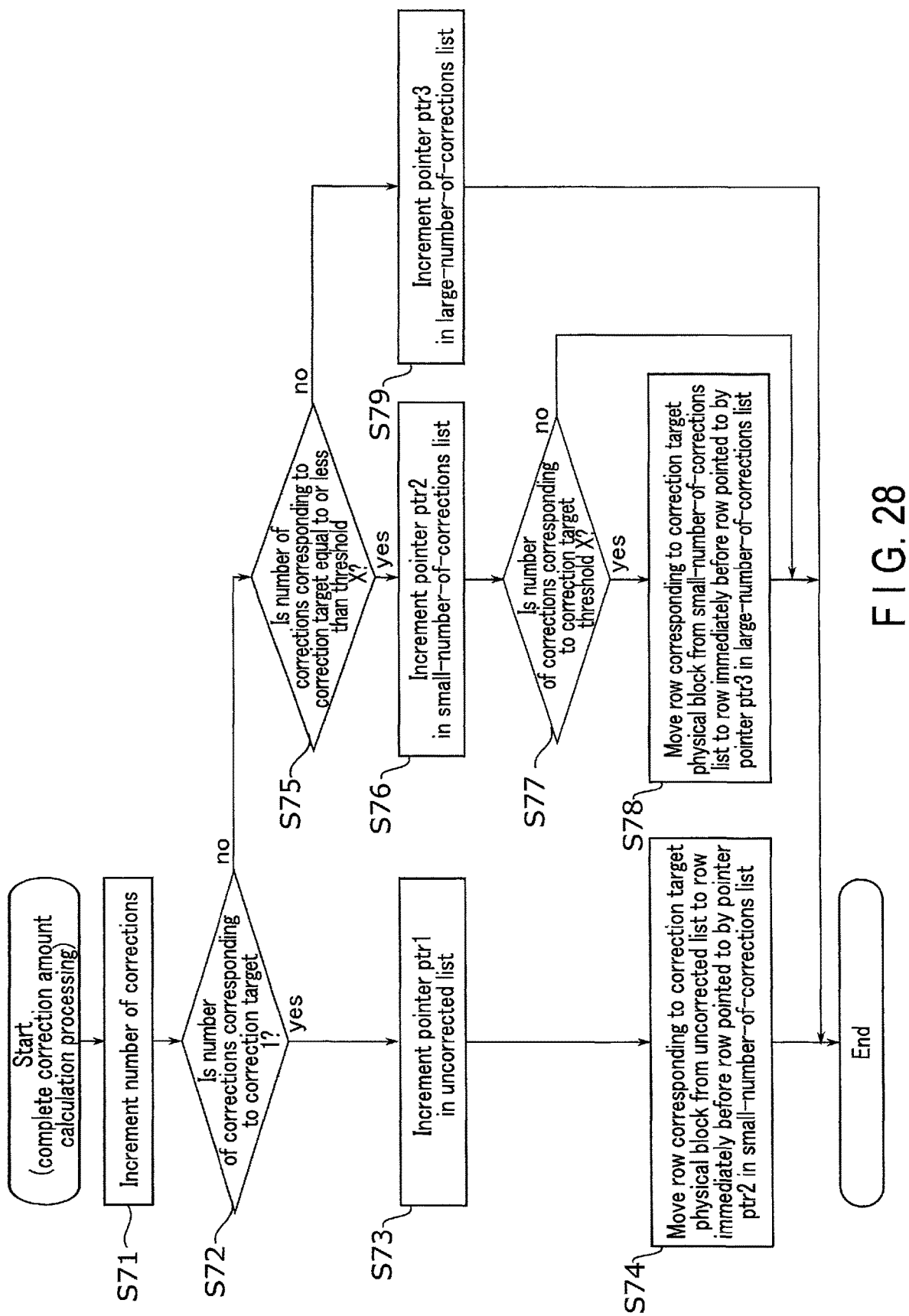
F I G. 28

MEMORY SYSTEM

CROSS-REFERENCE TO RELATED APPLICATIONS

This application is a continuation of and claims benefit under 35 U.S.C. § 120 to U.S. application Ser. No. 17/349,358, filed Jun. 16, 2021, which is based upon and claims the benefit of priority under 35 U.S.C. § 119 from Japanese Patent Application No. 2021-039433, filed Mar. 11, 2021, the entire contents of each of which are incorporated herein by reference.

FIELD

Embodiments described herein relate generally to a memory system.

BACKGROUND

A memory system that includes a NAND flash memory as a non-volatile memory and a memory controller that controls the non-volatile memory is known. The memory controller corrects a read voltage used to read data from the NAND flash memory.

BRIEF DESCRIPTION OF THE DRAWINGS

FIG. 4 is a circuit diagram showing an example of a configuration of a physical block according to the first embodiment.

FIG. 6 is a diagram showing an example of representative correction amount information of a memory system according to the first embodiment.

FIG. 8 is a diagram showing an example of memory management information of the memory system according to the first embodiment.

FIG. 13 is a diagram showing an example of memory management information of a memory system according to a second embodiment.

FIG. 14 is a flowchart showing an example of a series of processing including write processing of the memory system according to the second embodiment.

FIG. 16 is a diagram showing an example of memory management information of a memory system according to a first modification of the second embodiment.

FIG. 18 is a schematic diagram showing an example of a timing of executing the correction amount calculation processing of the memory system according to the first modification of the second embodiment.

FIG. 20 is a diagram showing an example of memory management information of a memory system according to the second modification of the second embodiment.

FIG. 21 is a schematic diagram showing an example of a timing of executing correction amount calculation processing of the memory system according to the second modification of the second embodiment.

FIG. 23 is a state transition diagram showing an example of a state transition associated with determination processing and correction amount calculation processing of a memory system according to a fourth embodiment.

FIG. 24 is a state transition diagram showing an example of a state transition associated with determination processing and correction amount calculation processing of a memory system according to a modification of the fourth embodiment.

FIG. 25 is a diagram showing an example of memory management information of a memory system according to a fifth embodiment.

FIG. 27 is a state transition diagram showing an example of a state transition associated with determination processing and correction amount calculation processing of the memory system according to the fifth embodiment.

FIG. 28 is a flowchart showing an example of processing of changing a correction frequency of the memory system according to the fifth embodiment.

DETAILED DESCRIPTION

Figure 1:
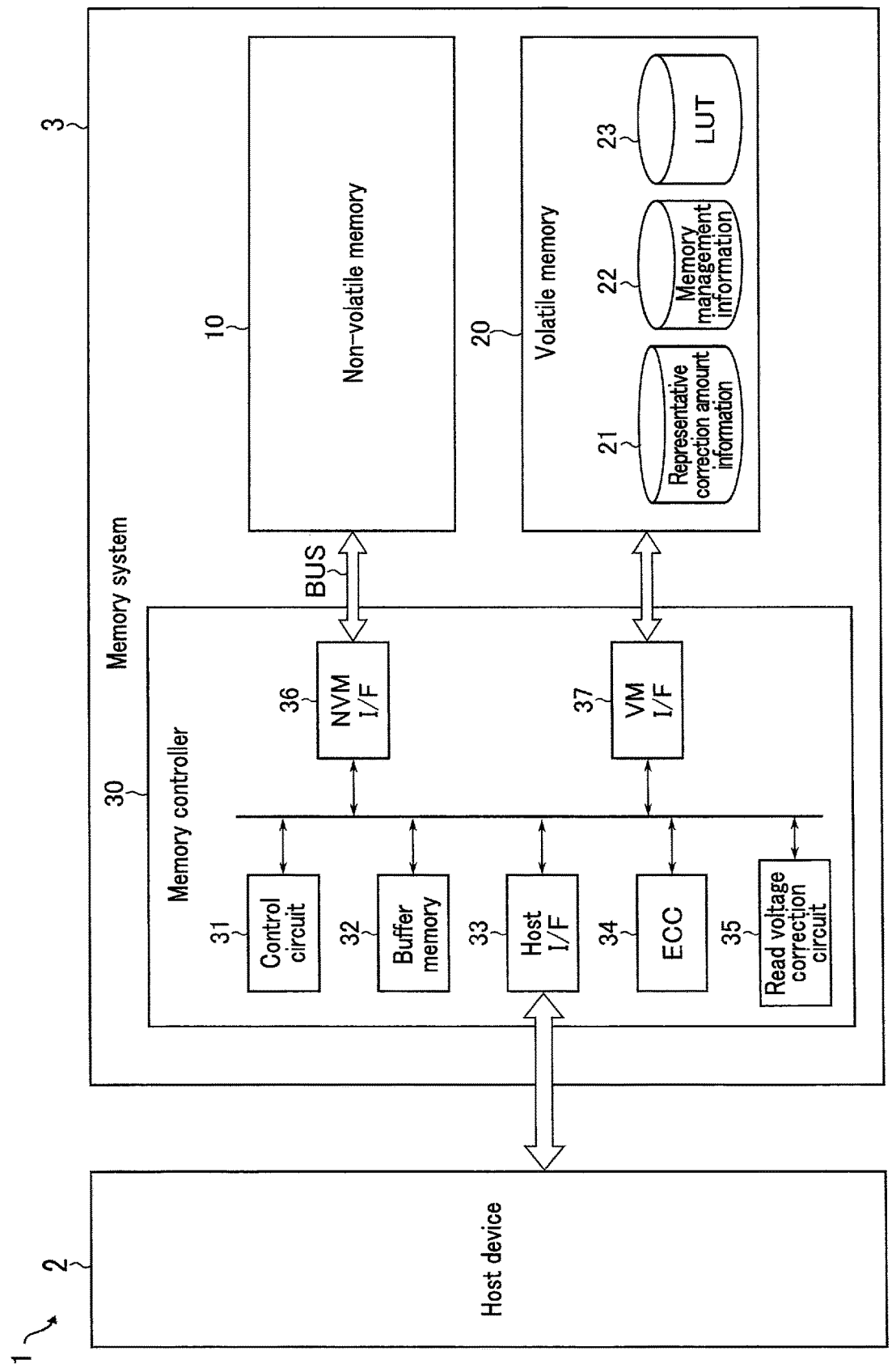
FIG. 1 is a block diagram showing an example of a configuration of an information processing system according to a first embodiment.

In general, according to one embodiment, a memory system includes a plurality of groups and a memory controller configured to execute a first operation. Each of the plurality of groups includes a plurality of cell units. Each of the plurality of cell units includes a plurality of memory cells. The first operation includes: based on a first correction amount associated with a target group, reading data from the target group; and updating the first correction amount to a second correction amount based on the data. The memory controller is configured to: select a first group as the target group; and when a condition is satisfied, select a second group as the target group after performing the first operation related to the first group.

Hereinafter, embodiments will be described with reference to the accompanying drawings. In the description below, constituent elements having the same functions and configurations will be denoted by common reference numerals or symbols. When a plurality of constituent elements assigned a common reference numeral or symbol are distinguished from each other, suffixes are added after the common reference numeral or symbol in order to make the distinction. When a plurality of constituent elements are not particularly distinguished from each other, the constituent elements are assigned only a common reference numeral or symbol without suffixes.

1. First Embodiment

1.1. Configuration

1.1.1. Information Processing System

A configuration of an information processing system according to a first embodiment will be described.

1.1.1. Memory System

FIG. 1 is a block diagram showing a configuration of an information processing system according to the first embodiment. As shown in FIG. 1, an information processing system 1 includes a host device 2 and a memory system 3.

The host device 2 is a data processing device that processes data using the memory system 3. The host device 2 is, for example, a personal computer or a server in a data center.

The memory system 3 is a memory device configured to be connected to the host device 2. The memory system 3 is, for example, a memory card such as an SD™ card, a universal flash storage (UFS), or a solid state drive (SSD). The memory system 3 executes data write processing, read processing and erase processing in accordance with a request (command) from the host device 2. The memory system 3 may execute write processing, read processing and erase processing as internal processing without any commands from the host device 2.

1.1.2. Memory System

An internal configuration of the memory system according to the first embodiment will be described.

The memory system 3 includes a non-volatile memory 10, a volatile memory 20, and a memory controller 30.

The non-volatile memory 10 includes a plurality of memory cell transistors that store data non-volatilely. The non-volatile memory 10 is, for example, a NAND flash memory.

The volatile memory 20 stores information for correctly reading data from the non-volatile memory 10. Specifically, the volatile memory 20 stores representative correction amount information 21, memory management information 22, and a look-up table (LUT) 23. The volatile memory 20 is, for example, a dynamic random access memory (DRAM). The representative correction amount information 21 and the memory management information 22 will be given in detail later.

The LUT 23 includes information associating a logical address with a physical address. The logical address is address information that uniquely identifies data. The logical address is designated by the host device 2. The physical address is address information that uniquely identifies a storage area in the non-volatile memory 10. The physical address is designated by the memory controller 30.

The memory controller 30 is configured by an integrated circuit such as a system-on-a-chip (SoC). The memory controller 30 controls the non-volatile memory 10 based on a request (host request) from the host device 2.

Specifically, the memory controller 30, for example, writes data to the non-volatile memory 10 based on a write request (host write request) from the host device 2. The memory controller 30 also reads data from the non-volatile memory 10 based on a read request (host read request) from the host device 2. The memory controller 30 then transmits data based on the read data to the host device 2.

The write request and the read request from the host device 2 respectively include a logical address of write target data and read target data. The memory controller 30 converts the logical address into a physical address by referring to the LUT 23, and thereby accesses a storage area in the non-volatile memory 10 as a write target and a read target. In the description below, the term "address" refers to the physical address, unless otherwise designated.

1.1.3. Memory Controller

Next, an internal configuration of the memory controller 30 will be described. The memory controller 30 includes a control circuit 31, a buffer memory 32, a host interface circuit (host I/F) 33, an error correction and check circuit (ECC) 34, a read voltage correction circuit 35, a non-volatile memory interface circuit (NVM I/F) 36, and a volatile memory interface circuit (VM I/F) 37. The functions of the components 31 to 37 of the memory controller 30, which will be described below, can be implemented in a hardware configuration or in a combined configuration of hardware resources and firmware.

The control circuit 31 controls the entire memory controller 30. The control circuit 31 includes, for example, a processor such as a central processing unit (CPU), and a read only memory (ROM).

The buffer memory 32 is a memory for buffering data between the host device 2 and the non-volatile memory 10. The buffer memory 32 is, for example, a static random access memory (SRAM). The buffer memory 32 temporarily stores write data and read data.

The host interface circuit 33 controls communications between the memory controller 30 and the host device 2. The host interface circuit 33 is coupled to the host device 2 via a host bus. The host bus is compatible with, for example, an SD™ interface, a serial attached SCSI (small computer system interface) (SAS), a serial ATA (advanced technology attachment) (SATA), or PCI (peripheral component interconnect) express™ (PCIe).

The ECC circuit 34 performs error detection processing and error correction processing on data stored in the non-volatile memory 10. Namely, in data write processing, the ECC circuit 34 provides an error correction code to the write data. In data read processing, the ECC circuit 34 decodes read data and detects a presence or absence of an error bit.

When an error bit is detected, the ECC circuit 34 specifies a column address (error location) of the error bit and corrects the error.

The read voltage correction circuit 35 functions to calculate a correction amount of a read voltage used when reading data from the non-volatile memory 10.

The non-volatile memory interface circuit 36 controls communications between the non-volatile memory 10 and the memory controller 30. The non-volatile memory interface circuit 36 is coupled to the non-volatile memory 10 via a memory bus BUS. The memory bus BUS is compatible with, for example, a single data rate (SDR) interface, a toggle double data rate (DDR) interface, or an open NAND flash interface (ONFI).

The volatile memory interface circuit 37 controls communications between the volatile memory 20 and the memory controller 30. A bus coupling the volatile memory 20 and the memory controller 30 is based on, for example, DRAM interface standards.

1.1.4. Memory Bus

Figure 2:
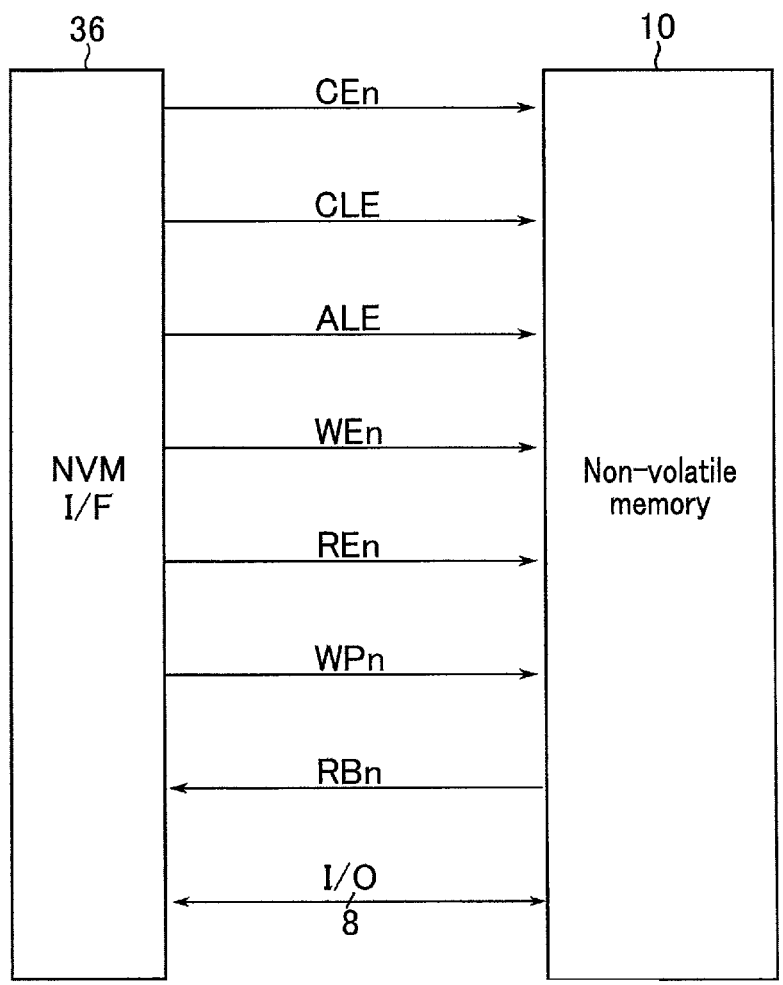
FIG. 2 is a block diagram showing an example of signals used in a memory bus according to the first embodiment.

Next, exemplary signals exchanged between the non-volatile memory 10 and the memory controller 30 will be described. FIG. 2 is a block diagram showing exemplary signals used in a memory bus according to the first embodiment.

The signals used in the memory bus BUS include, for example, a chip enable signal CEn, a command latch enable signal CLE, an address latch enable signal ALE, a write enable signal WEn, a read enable signal REn, a write protect signal WPn, a ready/busy signal RBn, and an input/output signal I/O. As used herein, the letter "n" at the end of the name of the signals indicates that the signals are asserted when the signals are at an "L (Low)" level.

The chip enable signal CEn is a signal to enable the non-volatile memory 10.

The command latch enable signal CLE and the address latch enable signal ALE are signals to notify the non-volatile memory 10 that the input signal I/O to the non-volatile memory 10 is a command and an address, respectively.

The write enable signal WEn is a signal to cause the non-volatile memory 10 to import the input signal I/O.

The read enable signal REn is a signal to read an output signal I/O from the non-volatile memory 10.

The write protect signal WPn is a signal to instruct the non-volatile memory 10 to prohibit data from being written and erased.

The ready/busy signal RBn is a signal indicating whether the non-volatile memory 10 is in a ready state or in a busy state. The ready state is a state in which the non-volatile memory 10 is able to receive a command from the memory controller 30. The busy state is a state in which the non-volatile memory 10 is unable to receive a command from the memory controller 30, except some commands such as a suspend command that instructs execution of the suspend processing, which will be described later. The ready/busy signal RBn at the "L" level indicates the busy state.

The input/output signal I/O is, for example, an 8-bit signal. The input/output signal I/O is a data entity transmitted and received between the non-volatile memory 10 and the memory controller 30. The input/output signal I/O includes a command, an address, and data such as write data and read data.

1.1.5. Non-volatile Memory

Figure 3:
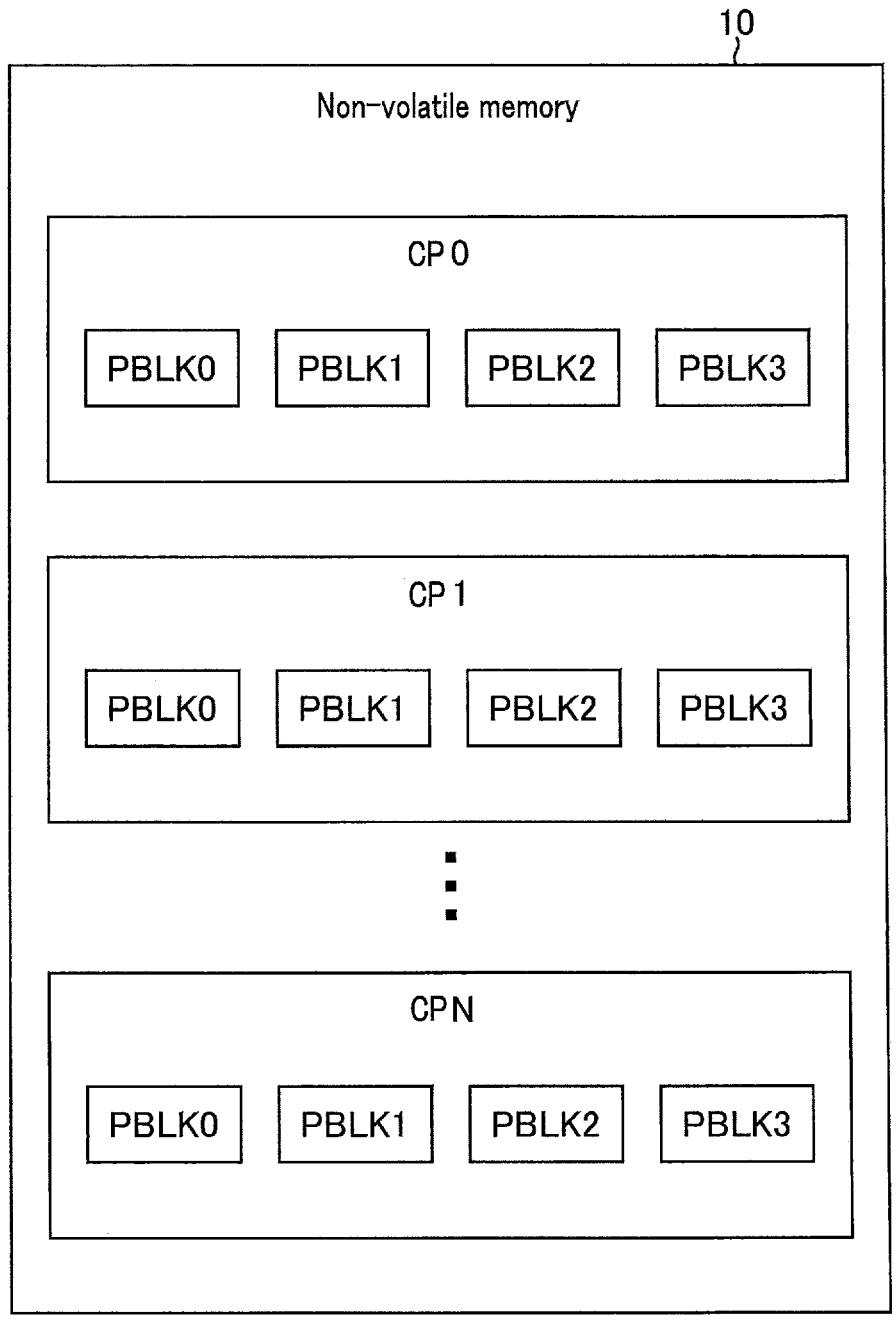
FIG. 3 is a block diagram showing an example of a configuration of a non-volatile memory according to the first embodiment.

Next, an internal configuration of the non-volatile memory 10 will be described. FIG. 3 is a block diagram showing an example of the configuration of the non-volatile memory according to the first embodiment. The non-volatile memory 10 includes a plurality of chips CP (CP0, CP1, . . . , CPN) (N being an integer of 2 or more). The chips can operate independently from each other. The respective chips CP function as a single NAND flash memory. The example in FIG. 3 shows a case where the non-volatile memory 10 includes three or more chips CP0 through CPN. However, the number of chips CP included in the non-volatile memory 10 is not limited to three or more and may be one or two.

The respective chips CP include a plurality of physical blocks PBLK. The physical block PBLK is a set including memory cell transistors. The physical block PBLK is used as a unit for erasing data, for example. The example in FIG. 3 shows a case where each chip CP includes four physical blocks PBLK0 through PBLK3. However, the number of physical blocks PBLK included in each chip is not limited to four and may be any number.

FIG. 4 is a circuit diagram showing an example of a configuration of the physical block according to the first embodiment. The physical block PBLK includes, for example, four string units SU0 through SU3. In FIG. 4, the configurations of the string units SU2 and SU3 are simplified.

Each string unit SU includes a plurality of NAND strings NS that are associated with bit lines BL0 through BLm (m being an integer of 1 or more), respectively. The NAND string NS includes, for example, memory cell transistors MT0 through MT7 and select transistors ST1 and ST2.

Each memory cell transistor MT includes a control gate and a charge storage layer, and stores data non-volatilely. Each of the select transistors ST1 and ST2 is used to select a string unit SU in various types of processing.

In each NAND string NS, the memory cell transistors MT0 through MT7 are coupled in series. The select transistor ST1 is coupled between ends of the memory cell transistors MT0 through MT7 coupled in series and the bit line BL associated therewith. The other ends of the memory cell transistors MT0 through MT7 coupled in series are coupled to the drain of the select transistor ST2. The source of the select transistor ST2 is coupled to a source line SL.

The gates of the select transistors ST1 included in the string units SU0 through SU3 in the same physical block PBLK are coupled in common to select gate lines SGD0 through SGD3, respectively. The control gates of the memory cell transistors MT0 through MT7 are coupled in common to word lines WL0 to WL7, respectively. The gates of the select transistors ST2 are coupled in common to a select gate line SGS.

The bit lines BL0 through BLm are shared by a plurality of physical blocks PBLK in the same chip CP. The same bit line BL is coupled to the NAND strings NS corresponding to the same column address. Each of the word lines WL0 through WL7 is provided in each physical block PBLK. The source line SL is shared by, for example, a plurality of physical blocks PBLK in the same chip.

A set of memory cell transistors MT coupled to a common word line WL in a single string unit SU is referred to as, for example, a cell unit CU, and is used as a unit for writing data. For example, the storage capacity of the cell unit CU including the memory cell transistors MT, which individually store 1-bit data, is defined as "1-page data". The 1-page data is used as a unit for reading data, for example. The cell unit CU may have a storage capacity of two-or-more-page data in accordance with the number of bits of data stored in the memory cell transistors MT.

The circuit configuration of the physical block PBLK described above is merely an example, and the configuration is not limited thereto. For example, the number of string units SU included in each physical block PBLK may be any number. The number of memory cell transistors MT and select transistors ST1 and ST2 that are included in each NAND string NS may be any number. The number of bit lines BL are may be one.

In the present embodiment, a single memory cell transistor MT can store 2-bit data. Namely, the memory cell transistors MT of the present embodiment are multi-level cells (MLC) that store 2-bit data. The 2-bit data stored in the MLC memory cell transistors is referred to as a lower bit and an upper bit in ascending order. A set of lower bits stored in the memory cell transistors MT included in the same cell unit CU is referred to as a "lower page", and a set of upper bits stored therein is referred to as an "upper page".

Figure 5:
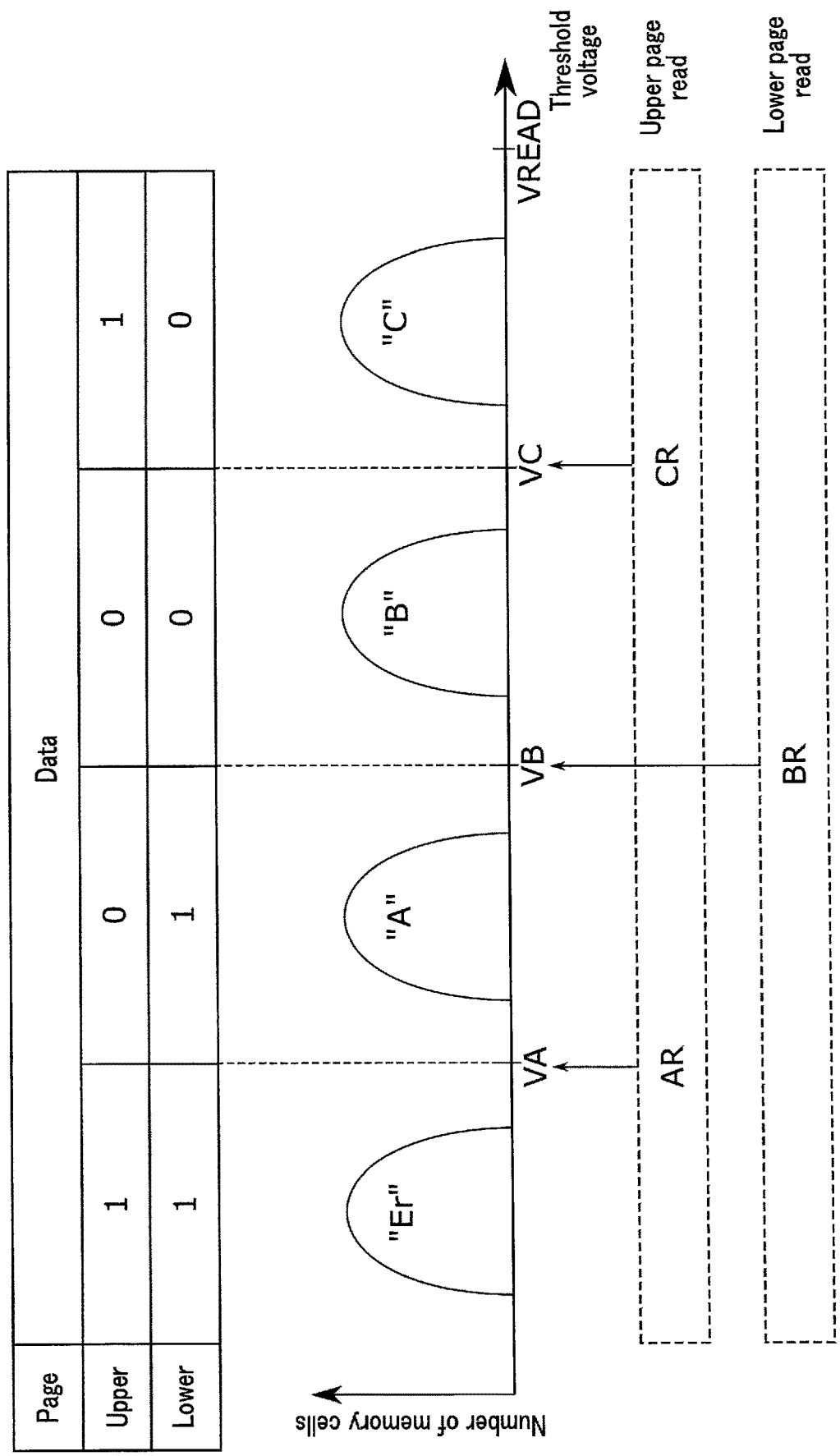
FIG. 5 is a schematic diagram showing an example of a threshold voltage distribution of memory cell transistors according to the first embodiment.

FIG. 5 is a schematic diagram showing an example of a threshold voltage distribution of the memory cell transistors MT according to the first embodiment. When the memory cell transistors MT store 2-bit data, a threshold voltage distribution thereof is divided into four distributions. The four threshold voltage distributions are referred to as an "Er" state, "A" state, "B" state, and "C" state in ascending order of the threshold voltage.

Voltages VA, VB, and VC shown in FIG. 5 are used to distinguish between two adjacent states in read processing. A voltage VREAD is a voltage applied to a non-selected word line during read processing. When the voltage VREAD is applied to the gate, the memory cell transistors MT are turned on, regardless of the data stored therein. The relationship among the values of these voltages is VA<VB<VC<VREAD.

The "Er" state among the above-described threshold voltage distributions corresponds to an erase state of the memory cell transistors MT. The threshold voltage in the "Er" state is lower than the voltage VA. The threshold voltage in the "A" state is equal to or higher than the voltage VA, and is lower than the voltage VB. The threshold voltage in the "B" state is equal to or higher than the voltage VB, and is lower than the voltage VC. The threshold voltage in the "C" state is equal to or higher than the voltage VC, and is lower than the voltage VREAD.

The four threshold voltage distributions described above are formed by writing 2-bit (2-page) data that include the lower bit and the upper bit. The four threshold voltage distributions respectively correspond to different 2-bit data. In the present embodiment, data is allocated to the "upper bit/lower bit" for the memory cell transistors MT included in each state, as shown below.

The memory cell transistors MT included in the "Er" state store "11" data. The memory cell transistors MT included in the "A" state store "01" data. The memory cell transistors MT included in the "B" state store "00" data. The memory cell transistors MT included in the "C" state store "10" data.

For lower page reading, voltage VB, which distinguishes between the "A" state and the "B" state, is used as a read voltage. The read processing using the voltage VB is referred to as read processing BR.

For upper page reading, voltage VA, which distinguishes between the "Er" state and the "A" state, and voltage VC, which distinguishes between the "B" state and the "C" state, are used as read voltages. The read processing using the voltage VA is referred to as read processing AR, and the read processing using the voltage VC is referred to as read processing CR.

1.1.6. Representative Correction Amount Information

Next, a configuration of the representative correction amount information 21 will be described. FIG. 6 is a diagram showing the configuration of the representative correction amount information of the memory system according to the first embodiment. As shown in FIG. 6, the representative correction amount information 21 stores information regarding a correction amount from a default value of the read voltage. In the representative correction amount information 21, all the memory cells in the non-volatile memory 10 are classified into several groups. For each group, a representative correction amount $\Delta VA$ of the read voltage VA, a representative correction amount $\Delta VB$ of the read voltage VB, and a representative correction amount $\Delta VC$ of the read voltage VC are stored as a representative correction amount $\Delta Va$ of the read voltages in the form of a digital-to-analogue converter (DAC) value. Namely, the representative correction amounts $\Delta VA$, $\Delta VB$, and $\Delta VC$ indicate a difference from the default values of the read voltages VA, VB, and VC, respectively.

The example in FIG. 6 shows a case where the group associated with the representative correction amount $\Delta Va$ is the physical block PBLK. Specifically, a set including $\Delta VA0$, $\Delta VB0$, and $\Delta VC0$ is included as the representative correction amount $\Delta Va$ allocated to the physical block PBLK0 of the chip CP0. Likewise, a set including $\Delta VA1$, $\Delta VB1$, and $\Delta VC1$, a set including $\Delta VA2$, $\Delta VB2$, and $\Delta VC2$, and a set including $\Delta VA3$, $\Delta VB3$, and $\Delta VC3$ are included as the representative correction amount $\Delta Va$ allocated to the physical blocks PBLK1 through PBLK3 of the chip CP0, respectively. With the above-described configuration, the physical block PBLK and the representative correction amount $\Delta Va$ are uniquely associated with each other.

The representative correction amount $\Delta Va$ can be used as a correction amount of the read voltage of a specific cell unit CU (representative cell unit CU) in the physical block PBLK. On the other hand, the representative correction amount $\Delta Va$ may not be optimal when used as a correction amount of the read voltage of a cell unit CU other than a representative cell unit CU. Therefore, the control circuit 31 calculates a correction amount of the read voltage optimal to a cell unit CU other than a representative cell unit CU based on the representative correction amount $\Delta Va$. In the description below, the correction amount calculated based on the representative correction amount $\Delta Va$ is referred to as a "conversion correction amount $\Delta Vb$".

Figure 7:
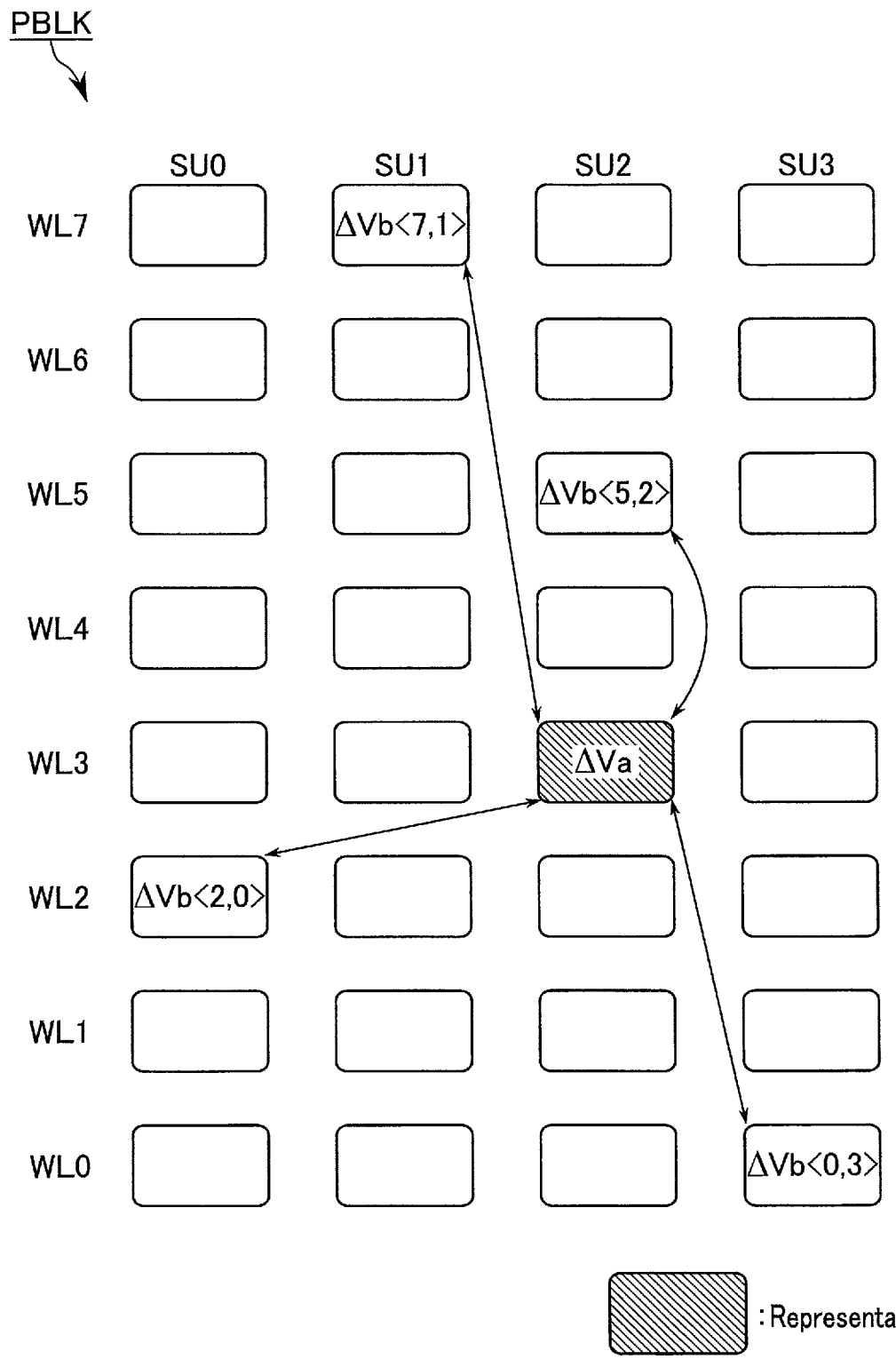
FIG. 7 is a schematic diagram showing an example of a relationship between a representative correction amount and a conversion correction amount in the physical block according to the first embodiment.

FIG. 7 is a schematic diagram showing an example of a relationship between the representative correction amount and the conversion correction amount in the physical block according to the first embodiment. The example in FIG. 7 shows a case where a cell unit CU corresponding to a set including the word line WL3 and the string unit SU2 is allocated as a representative cell unit CU in a physical block PBLK.

As shown in FIG. 7, the representative correction amount $\Delta Va$ is allocated to the representative cell unit CU. The conversion correction amount $\Delta Vb$ is allocated separately to each cell unit CU other than the representative cell unit CU.

Specifically, a conversion correction amount $\Delta Vb<2, 0>$, for example, is used in a cell unit CU corresponding to a set including the word line WL2 and the string unit SU0. A conversion correction amount $\Delta Vb<7, 1>$ is used in a cell unit CU corresponding to a set including the word line WL7 and the string unit SU1. A conversion correction amount $\Delta Vb<5, 2>$ is used in a cell unit CU corresponding to a set including the word line WL5 and the string unit SU2. A conversion correction amount ΔVb<0, 3> is used in a cell unit CU corresponding to a set including the word line WL0 and the string unit SU3. The values of the conversion correction amounts ΔVb may be different or the same. The value of the conversion correction amount ΔVb and the value of the representative correction amount ΔVa may be different or the same.

The control circuit 31 can calculate a conversion correction amount ΔVb used in any cell unit CU in the physical block PBLK based on the representative correction amount ΔVa. The control circuit 31 can also calculate the representative correction amount ΔVa based on the conversion correction amount ΔVb used in any cell unit CU in the physical block PBLK. Namely, the control circuit 31 functions to reciprocally convert the representative correction amount ΔVa and the conversion correction amount ΔVb. For example, such a conversion function is stored in advance in ROM in the control circuit 31. The conversion function is fulfilled by, for example, conversion information that shows the relationship between the representative correction amount ΔVa and the conversion correction amount ΔVb in a functional form or a table form.

1.1.7. Memory Management Information

Figure 8:
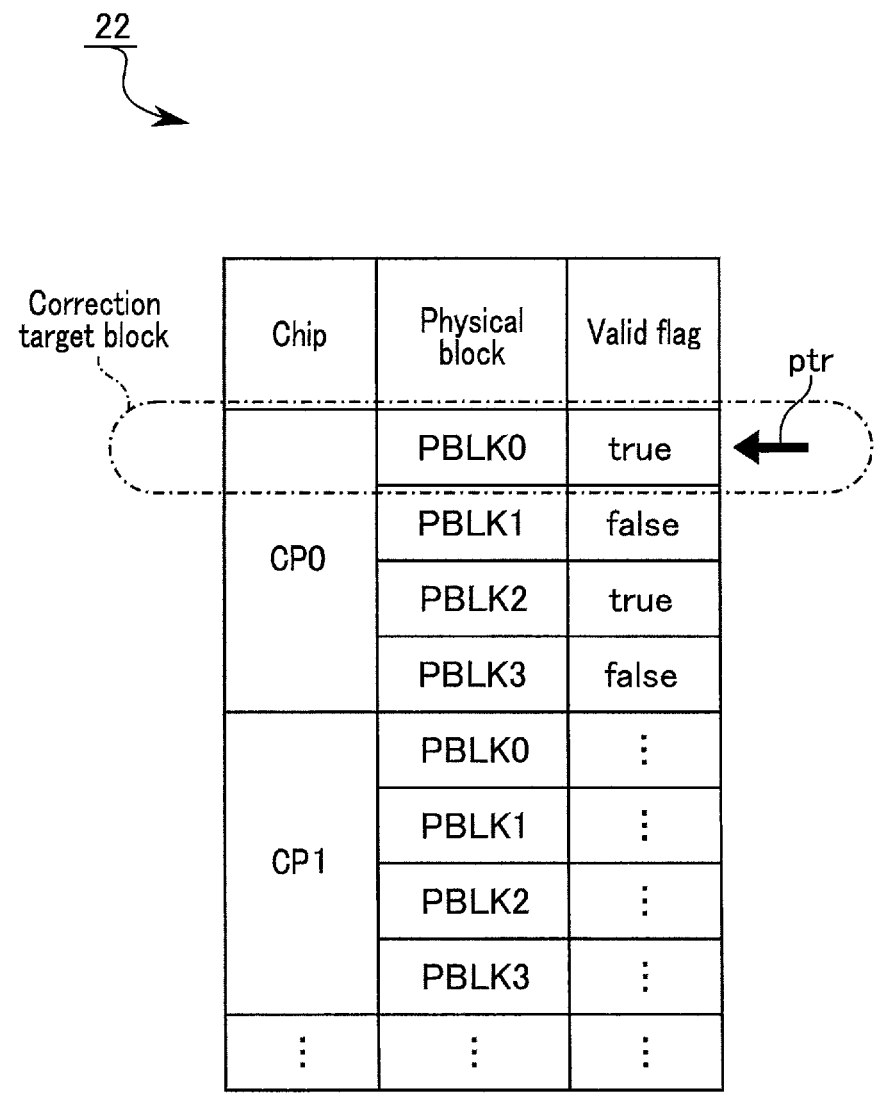

Next, a configuration of the memory management information 22 will be described. FIG. 8 is a diagram showing the configuration of the memory management information of the memory system according to the first embodiment.

As shown in FIG. 8, the memory management information 22 stores a valid flag indicating whether or not valid data is written in the physical block PBLK. If the valid flag is "true", it indicates that valid data is written in the physical block PBLK (that the physical block PBLK is a valid block). On the other hand, if the valid flag is "false", it indicates that valid data is not written in the physical block PBLK (that the physical block PBLK is not a valid block).

Also, a pointer ptr pointing to one physical block PBLK is allocated in the memory management information 22. The physical block PBLK pointed to by the pointer ptr is indicated as a block to be subjected to the processing (correction amount calculation processing) of calculating the representative correction amount ΔVa. In the description below, the physical block PBLK to be subjected to the correction amount calculation processing is also referred to as a "correction target block". The example in FIG. 8 shows a case where among the physical blocks PBLK0 and PBLK2 of the chip CP0 as valid blocks, the physical block PBLK0 is a correction target block.

1.2. Operation

Next, an operation of the memory system according to the first embodiment will be described.

1.2.1. Write Processing

Figure 9:
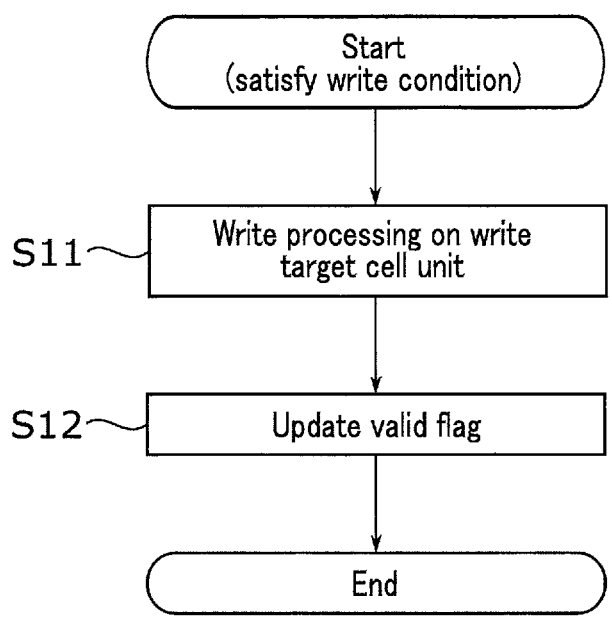
FIG. 9 is a flowchart showing an example of a series of processing including write processing of the memory system according to the first embodiment.

FIG. 9 is a flowchart showing an example of a series of processing including write processing of the memory system according to the first embodiment.

When the write condition is satisfied ("Start"), the memory controller 30 causes the non-volatile memory 10 to execute write processing on a write target cell unit CU (S11).

Satisfying the write condition includes a certain amount of write data being stored in the buffer memory 32 in response to a host write request. Satisfying the write condition also includes satisfying the condition for starting the write processing executed by the memory controller 30 in the internal processing. The internal processing includes garbage collection (compaction) processing, refresh processing, wear leveling processing, and non-volatilization processing of the management information of the non-volatile memory 10.

In the write processing, the memory controller 30 transmits the write data in the buffer memory 32 to the non-volatile memory 10. The non-volatile memory 10 stores the received write data in a page buffer (not shown) in the non-volatile memory 10 (i.e., "data-in"). Based on the write data stored in the page buffer, the non-volatile memory 10 executes processing of writing to a write target cell unit CU.

When the write processing of S11 is completed, the memory controller 30 updates the valid flag in the memory management information 22 (S12). Specifically, the valid flag corresponding to the physical block PBLK to which valid data has been written through the processing of S11 is updated from "false" to "true". Thus, the memory controller 30 can manage the physical block PBLK that may be subjected to the correction amount calculation processing.

When the processing of S12 is completed, the series of processing including the write processing will be finished (End).

Figure 10:
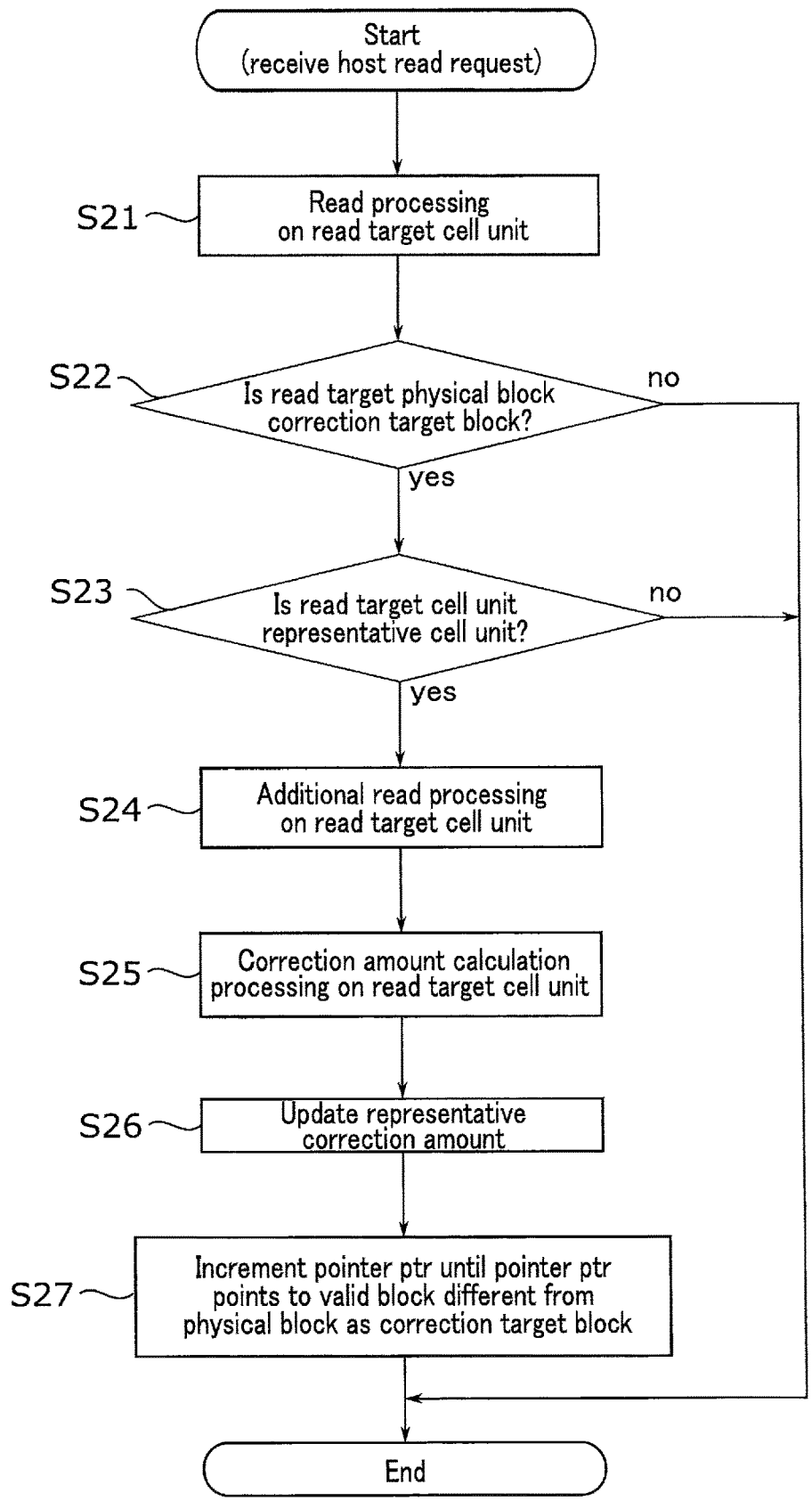
FIG. 10 is a flowchart showing an example of a series of processing including determination processing and correction amount calculation processing of the memory system according to the first embodiment.

1.2.2. Determination Processing and Correction Amount Calculation Processing FIG. 10 is a flowchart showing an example of a series of processing including determination processing and correction amount calculation processing of the memory system according to the first embodiment. A series of processing including determination processing and correction amount calculation processing is executed in accordance with the condition for starting the processing (determination processing) of determining whether or not the correction amount calculation processing can be executed. In the example shown in FIG. 10, the condition for starting the determination processing is that the memory controller 30 receives a host read request.

Namely, when a host read request is received from the host device 2 ("Start"), the memory controller 30 causes the non-volatile memory 10 to execute read processing on a read target cell unit CU (S21).

In the read processing of S21, the memory controller 30 transmits a correction amount of the read voltage to the non-volatile memory 10. If the read target cell unit CU is a representative cell unit CU, the memory controller 30 transmits the representative correction amount ΔVa corresponding to the representative cell unit CU to the non-volatile memory 10. If the read target cell unit CU is a cell unit CU other than the representative cell unit CU, the memory controller 30 calculates the conversion correction amount ΔVb corresponding to said cell unit CU based on the representative correction amount ΔVa, and transmits the calculated conversion correction amount ΔVb to the non-volatile memory 10.

Based on the received representative correction amount ΔVa or conversion correction amount ΔVb, the non-volatile memory 10 executes the processing of reading from the read target cell unit CU. The non-volatile memory 10 transmits read data to the memory controller 30.

The memory controller 30 temporarily stores the received read data in the buffer memory 32. Also, the memory controller 30 executes error detection processing and error correction processing on the received read data to thereby generate error-corrected data. The memory controller 30 then transmits the error-corrected data to the host device 2. Namely, the memory controller 30 transmits data based on the received read data to the host device 2.

The memory controller 30 determines whether or not the physical block PBLK subjected to the read processing of S21 is a correction target block (S22). Specifically, the memory controller 30 refers to the memory management information 22 and determines whether or not the physical block PBLK pointed to by the pointer ptr is a physical block PBLK that includes a read target cell unit CU.

If the read target physical block PBLK is not a correction target block (S22; no), the series of processing including the determination processing and the correction amount calculation processing will be finished (End). If the read target physical block PBLK is a correction target block (S22; yes), the memory controller 30 further determines whether or not the read target cell unit CU is a representative cell unit CU (S23). To be specific, for the processing of S21, the memory controller 30 determines whether or not the representative correction amount ΔVa has been transmitted to the non-volatile memory 10.

If the read target cell unit CU is not a representative cell unit CU (S23; no), the series of processing including the determination processing and the correction amount calculation processing will be finished (End). If the read target cell unit CU is a representative cell unit CU (S23; yes), the memory controller 30 causes the non-volatile memory 10 to execute additional read processing on the read target cell unit CU (S24). The read processing of S24 is processing of reading at least one page different from the page read in the read processing of S21. For example, when the lower page is read in the read processing of S21, the upper page of the same cell unit CU is read in the read processing of S24. The memory controller 30 temporarily stores the read data received through the read processing of S24 in the buffer memory 32.

Based on the read data received through the read processing of S21 and S24, the memory controller 30 performs the correction amount calculation processing on the read target cell unit CU (i.e., representative cell unit CU) (S25). Thereby, the memory controller 30 calculates the representative correction amount ΔVa of the read target cell unit CU.

The memory controller 30 stores the representative correction amount ΔVa calculated in the processing of S25 in the representative correction amount information 21 in the volatile memory 20 (S26). Thereby, the representative correction amount ΔVa of the correction target block is updated to an optimal state.

The memory controller 30 refers to the memory management information 22 and increments the pointer ptr until the pointer ptr points to a valid block different from the physical block PBLK as a correction target block (S27). Thus, a correction target block in the next series of processing including the correction amount calculation processing will be a physical block PBLK different from the correction target block in the current series of processing including the correction amount calculation processing.

When the processing of S27 is completed, the series of processing including the determination processing and the correction amount calculation processing will be finished (End).

1.2.3. Details of Correction Amount Calculation Processing

Details of the correction amount calculation processing of S25 will be described. Hereinafter, the correction amount calculation processing based on data read using a default value of the read voltage will be described.

After the processing of S24, the ECC circuit 34 executes error detection processing on each of the data read through the read processing of S21 and S24. Thereby, the read voltage correction circuit 35 can identify a dataset including read data before correction and read data after correction for each column address. The read voltage correction circuit 35 can thus identify, for each column address, a (true) state in which data is written and a state (that may include an error) in which data is read. Specifically, the read voltage correction circuit 35 can, for example, identify the number EN12 of memory cells from which data written as the "A" state was erroneously read as the "Er" state. Also, the read voltage correction circuit 35 can identify the number EN21 of memory cells from which data written as the "Er" state was erroneously read as the "A" state.

Figure 11:
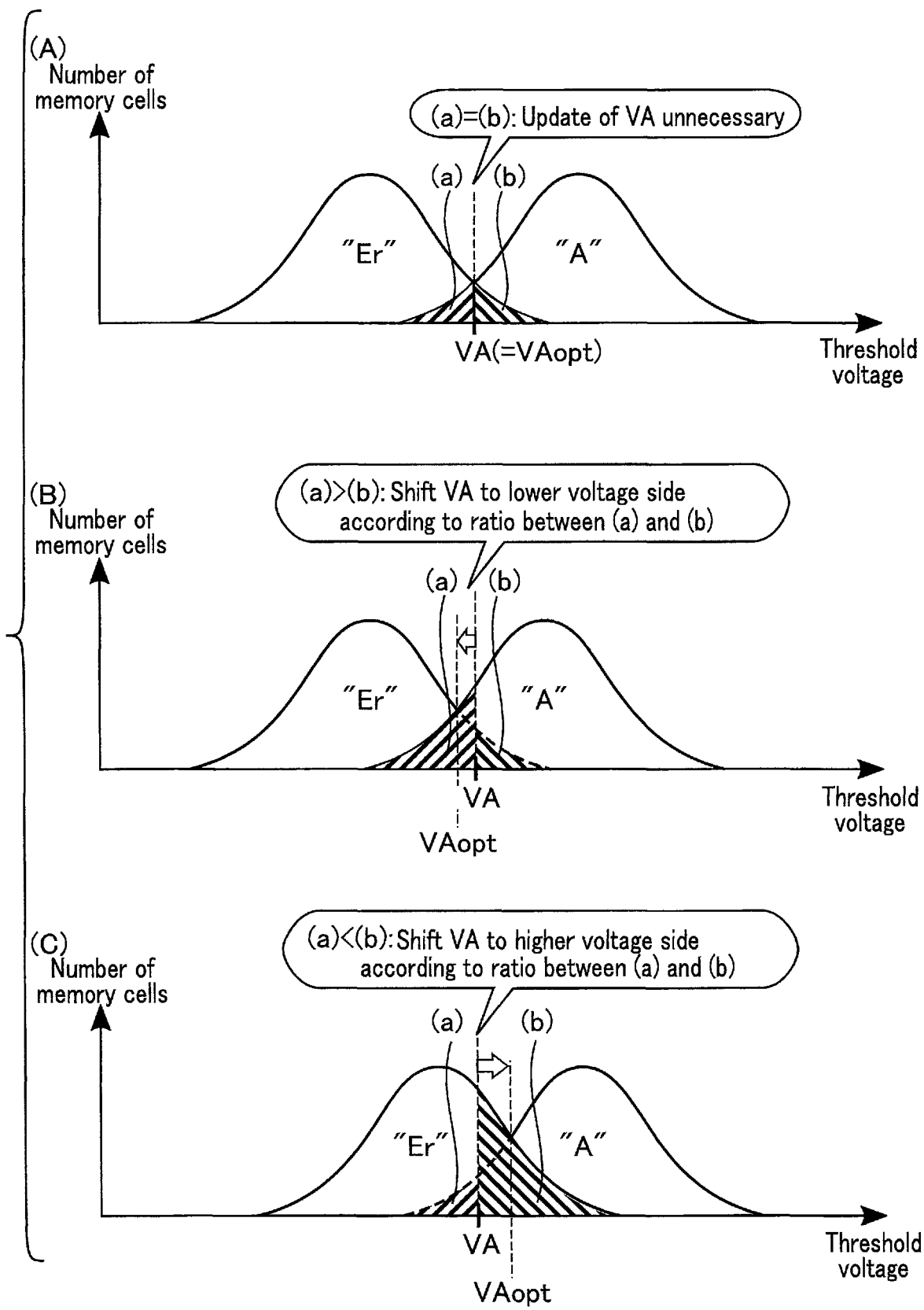
FIG. 11 is a schematic diagram showing details of the correction amount calculation processing of the memory system according to the first embodiment.

FIG. 11 is a schematic diagram showing details of the correction amount calculation processing of the memory system according to the first embodiment. The example in FIG. 11 shows a case where a correction amount of the read voltage VA is calculated. In FIG. 11, the number EN12 of memory cells from which data written as the "A" state was erroneously read as the "Er" state corresponds to an area of a region (a) in FIGS. 11(A) to 11(C). The number EN21 of memory cells from which data written as the "Er" state was erroneously read as the "A" state corresponds to an area of a region (b) in FIGS. 11(A) to 11(C).

FIG. 11(A) shows a case where the read voltage VA is equal to a threshold voltage VAopt at a position where the two threshold voltage distributions corresponding to the "Er" state and the "A" state cross each other. In the case shown in FIG. 11(A), the area of the region (a) and the area of the region (b) are equal to each other. In this case, the number EN (=EN12+EN21) of error bits generated between the "Er" state and the "A" state is expected to be minimum. Therefore, the read voltage correction circuit 35 determines that the read voltage VA need not be updated. Namely, the read voltage correction circuit 35 calculates a correction amount ΔVA of "0" (ΔVA=0).

FIG. 11(B) shows a case where the read voltage VA is on a higher voltage side than the threshold voltage VAopt at the position where the two threshold voltage distributions corresponding to the "Er" state and the "A" state cross each other. In the case of FIG. 11(B), the area of the region (a) is larger than the area of the region (b). In this case, the number EN of error bits is larger than the number EN of error bits of the case of FIG. 11(A), and thus is unfavorable. Therefore, the read voltage correction circuit 35 shifts the read voltage VA to a lower voltage side so that it becomes closer to the voltage VAopt. Namely, the read voltage correction circuit 35 calculates a negative correction amount ΔVA (ΔVA<0).

FIG. 11(C) shows a case where the read voltage VA is on a lower voltage side than the threshold voltage VAopt at the position where the two threshold voltage distributions corresponding to the "Er" state and the "A" state cross each other. In the case of FIG. 11(C), the area of the region (a) is smaller than the area of the region (b). In this case, the number EN of error bits is larger than the number EN of error bits of the case of FIG. 11(A), and thus is unfavorable. Therefore, the read voltage correction circuit 35 shifts the read voltage VA to a higher voltage side so that it becomes closer to the voltage VAopt. Namely, the read voltage correction circuit 35 calculates a positive correction amount ΔVA (ΔVA>0).

An absolute value of a difference between the area of the region (a) and the area of the region (b) is expected to increase as the read voltage VA deviates from the threshold voltage VAopt. Therefore, the read voltage correction circuit 35 determines the correction amount ΔVA of the read voltage VA according to the ratio between the area of the region (a) and the area of the region (b).

Thus, it is possible to determine an appropriate correction amount according to the degree of the overlap of the threshold voltage distributions and calculate the correction amount ΔVA so that the read voltage VA becomes closer to the threshold voltage VAopt.

Although not shown in the figure, the correction amounts ΔVB and ΔVC are calculated for the other read voltages VB and VC as well as in the case of the read voltage VA.

Through the operations described above, the representative correction amount ΔVa stored in the representative correction amount information 21 is updated based on the data read from the representative cell unit CU. In the subsequent read processing, a value obtained by adding the updated representative correction amount ΔVa to the default value of the read voltage can be used as a new read voltage.

In the correction amount calculation processing based on data read using a value (VA0+ΔVApre) obtained by adding a correction amount ΔVApre to a default value VA0 of the read voltage VA, the correction amount ΔVApre is updated to a correction amount ΔVApost described below. Namely, when the area of the region (a) and the area of the region (b) are equal to each other, as shown in FIG. 11(A), the correction amount OVA need not be updated. Therefore, a relationship "correction amount ΔVApost=correction amount ΔVApre" is satisfied. When the area of the region (a) is larger than the area of the region (b), as shown in FIG. 11(B), the correction amount ΔVApost is updated to a value lower than the correction amount ΔVApre. When the area of the region (a) is smaller than the area of the region (b), as shown in FIG. 11(C), the correction amount ΔVApost is updated to a value higher than the correction amount ΔVApre.

1.3. Advantageous Effects of First Embodiment

According to the first embodiment, the memory controller 30 defines a pointer ptr pointing to one of the physical blocks PBLK. The physical block PBLK pointed to by the pointer ptr will be a correction target block. Thus, the memory controller 30 can select a physical block PBLK to be subjected to the correction amount calculation processing before determining whether or not the correction amount calculation processing can be executed.

Also, when the memory controller 30 receives a host read request, the memory controller 30 starts a series of processing including the determination processing and the correction amount calculation processing. When a read target is a representative cell unit CU in a correction target block, the memory controller 30 executes the correction amount calculation processing for the correction target block. Specifically, the memory controller 30 reads necessary data from a representative cell unit CU using the representative correction amount ΔVa corresponding to the representative cell unit CU, and updates the representative correction amount ΔVa based on the data. Thus, the representative correction amount ΔVa of the correction target block can be maintained in an optimal state.

After the correction amount calculation processing, the memory controller 30 increments the pointer ptr until the pointer ptr points to a valid block different from the physical block PBLK as a correction target block. Thus, correction target blocks can be patrolled so that the correction amount calculation processing will be executed for all the valid blocks at a similar frequency. In addition, since the data read in response to the host read request can also be used for the correction amount calculation processing, an increase in the processing amount required for the correction amount calculation processing can be suppressed. Therefore, an increase in the management load of the read voltage can be suppressed.

1.4. Modification of First Embodiment

In the first embodiment described above, a case is shown where a read target of a host read request is a representative cell unit CU in a correction target block; however the embodiment is not limited thereto. For example, a read target may be a cell unit CU other than a representative cell unit CU in a correction target block.

Figure 12:
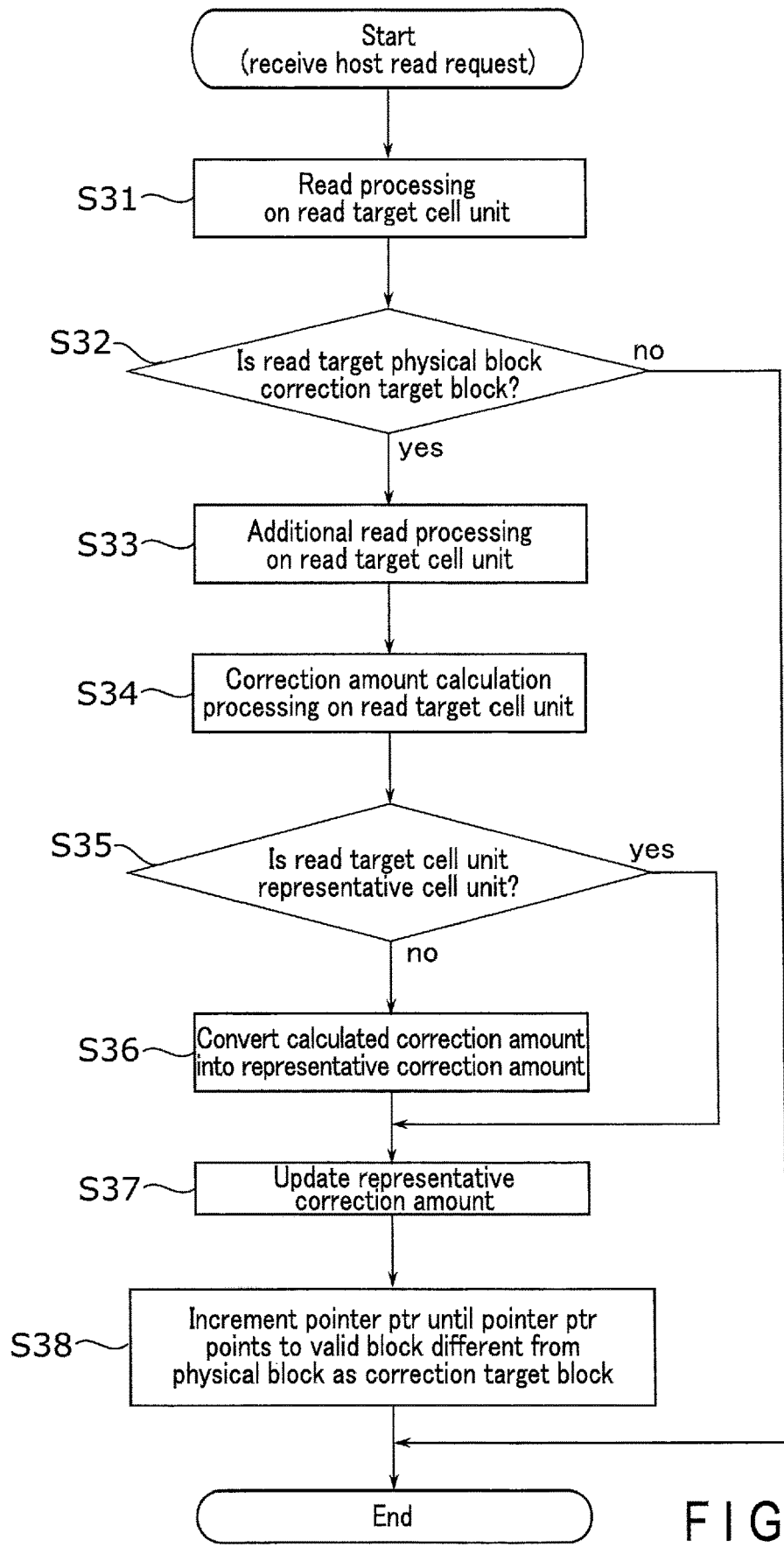
FIG. 12 is a flowchart showing an example of a series of processing including determination processing and correction amount calculation processing of a memory system according to a modification of the first embodiment.

FIG. 12 is a flowchart showing an example of a series of processing including determination processing and correction amount calculation processing of a memory system according to a modification of the first embodiment.

FIG. 12 corresponds to FIG. 10 of the first embodiment. In the example shown in FIG. 12, the condition for starting the determination processing is that the memory controller 30 receives a host read request, as in the example shown in FIG. 10.

Namely, when a host read request is received from the host device 2 ("Start"), the memory controller 30 causes the non-volatile memory 10 to execute read processing on a read target cell unit CU (S31). Since the processing of S31 is the same as the processing of S21 shown in FIG. 10, a description of the processing is omitted.

The memory controller 30 determines whether or not the physical block PBLK subjected to the read processing of S21 is a correction target block (S32). Specifically, the memory controller 30 refers to the memory management information 22 and determines whether or not the physical block PBLK pointed to by the pointer ptr is a physical block PBLK that includes a read target cell unit CU.

If the read target physical block PBLK is not a correction target block (S32; no), the series of processing including the determination processing and the correction amount calculation processing will be finished (End). If the read target physical block PBLK is a correction target block (S32; yes), the memory controller 30 causes the non-volatile memory 10 to execute additional read processing on the read target cell unit CU (S33). The read processing of S33 is processing of reading at least one page different from the page read in the read processing of S31. For example, when the lower page is read in the read processing of S31, the upper page of the same cell unit CU is read in the read processing of S33. The memory controller 30 temporarily stores the read data received through the read processing of S33 in the buffer memory 32.

Based on the read data received through the read processing of S31 and S33, the memory controller 30 performs the correction amount calculation processing on the read target cell unit CU (S34). Thereby, the memory controller 30 calculates a correction amount of the read target cell unit CU.

When the correction amount calculation processing is completed, the memory controller 30 determines whether or not the read target cell unit CU is a representative cell unit CU (S35). To be specific, for the processing of S31, the memory controller 30 determines whether or not the representative correction amount ΔVa has been transmitted to the non-volatile memory 10.

If the read target cell unit CU is not a representative cell unit CU (S35; no), the memory controller 30 converts the correction amount calculated in the correction amount calculation processing of S34 into the representative correction amount ΔVa (S36). Specifically, the memory controller 30 regards the correction amount calculated in the correction amount calculation processing of S34 as the conversion correction amount ΔVb for the read target cell unit CU. As described above, the memory controller 30 can reciprocally convert the conversion correction amount ΔVb for any cell unit CU into the corresponding representative correction amount ΔVa using the conversion information stored in ROM. Thus, the memory controller 30 converts the correction amount calculated in the correction amount calculation processing of S34 into the representative correction amount ΔVa based on the conversion information. If the read target cell unit CU is a representative cell unit CU (S35; yes), the correction amount calculated in the correction amount calculation processing of S34 is the representative correction amount ΔVa; therefore, the processing of S36 is omitted.

After the processing of S36, the memory controller 30 stores the representative correction amount ΔVa calculated in the processing of S34 or S36 in the representative correction amount information 21 in the volatile memory 20 (S37). Thereby, the representative correction amount ΔVa of the correction target block is updated to an optimal state.

The memory controller 30 refers to the memory management information 22 and increments the pointer ptr until the pointer ptr points to a valid block different from the physical block PBLK as a correction target block (S38). Thus, a correction target block in the next series of processing including the correction amount calculation processing will be a physical block PBLK different from the correction target block in the current series of processing including the correction amount calculation processing.

When the processing of S38 is completed, the series of processing including the determination processing and the correction amount calculation processing will be finished (End).

According to the modification of the first embodiment, even when the read target is a cell unit CU other than the representative cell unit CU, the memory controller 30 executes the correction amount calculation processing for the correction target block. Specifically, the memory controller 30 uses the conversion correction amount ΔVb to read necessary data from the read target cell unit CU. The memory controller 30 executes the correction amount calculation processing based on said data and updates the conversion correction amount ΔVb. The memory controller 30 uses the conversion information to calculate a new representative correction amount ΔVa from the updated conversion correction amount ΔVb. The memory controller 30 then updates the representative correction amount ΔVa with the new representative correction amount ΔVa. Thus, the representative correction amount ΔVa of the correction target block can be maintained in an optimal state.

2. Second Embodiment

Next, a memory system according to a second embodiment will be described. The second embodiment is different from the first embodiment in that the pointer ptr pointing to a correction target block is not defined. The description below omits descriptions of the same configurations and operations as those of the first embodiment, and mainly configurations and operations differing from those of the first embodiment will be described.

2.1. Memory Management Information

FIG. 13 is a diagram showing a configuration of memory management information of a memory system according to the second embodiment. FIG. 13 corresponds to FIG. 8 of the first embodiment.

As shown in FIG. 13, the memory management information 22 stores the number of remaining read operations in addition to a valid flag. The number of remaining read operations indicates the number of times read processing is executed until execution of the correction amount calculation processing for a corresponding valid physical block PBLK is permitted. Namely, when the number of remaining read operations of the physical block PBLK in which the valid flag is "true" becomes 0, the memory controller 30 can execute the correction amount calculation processing for the physical block PBLK.

The pointer ptr is not defined in the memory management information 22 according to the second embodiment. Namely, in the second embodiment, correction target blocks are determined at the same time when it is determined, through the determination processing, that the correction amount calculation processing is executed. On this point, the second embodiment is different from the first embodiment in which a correction target block is determined by the pointer ptr before the determination processing of determining whether or not the correction amount calculation processing can be executed is executed.

2.2. Write Processing

FIG. 14 is a flowchart showing an example of a series of processing including write processing of the memory system according to the second embodiment. In FIG. 14, processing S13 is further added to the process shown in FIG. 10 of the first embodiment.

The processing of S11 and S12 in FIG. 14 is the same as the processing of S11 and S12 in FIG. 10. Namely, when the write condition is satisfied ("Start"), the memory controller 30 causes the non-volatile memory 10 to execute write processing on a write target cell unit CU (S11). When the write processing of S11 is completed, the memory controller 30 updates the valid flag in the memory management information 22 (S12).

When the processing of S12 is completed, the memory controller 30 initializes the number of remaining read operations in the memory management information 22 (S13). Specifically, the number of remaining read operations corresponding to the physical block PBLK in which the valid flag has been updated from "false" to "true" through the processing of S12 is initialized to any value of 1 or more (e.g., 3). In a case where the number of remaining read operations is initialized to 3, when the read processing in which said physical block PBLK is a read target is executed three times, said physical block PBLK will be a correction target block.

When the processing of S13 is completed, the series of processing including the write processing will be finished (End).

2.3. Determination Processing and Correction Amount Calculation Processing

Figure 15:
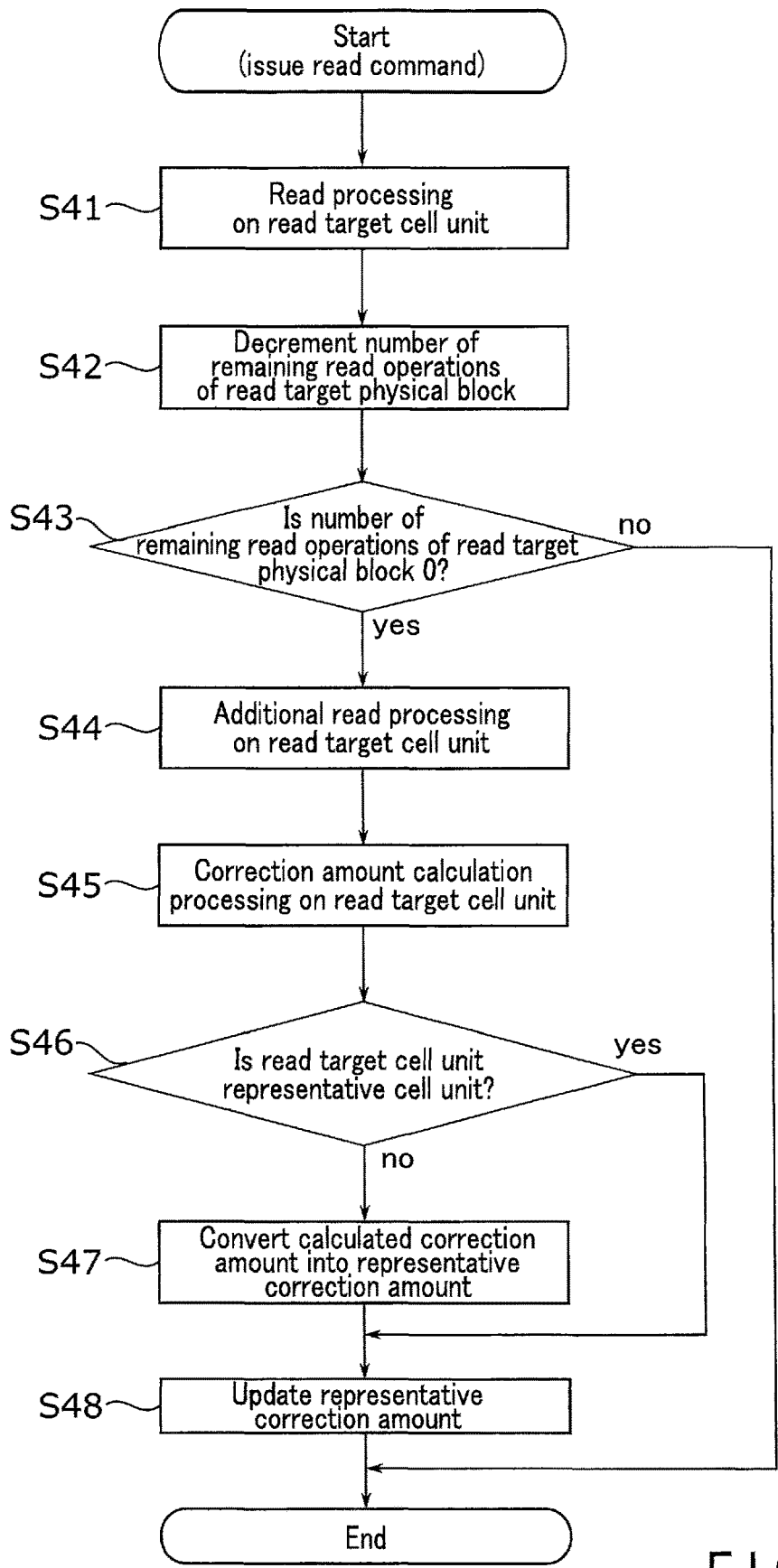
FIG. 15 is a flowchart showing an example of a series of processing including determination processing and correction amount calculation processing of the memory system according to the second embodiment.

FIG. 15 is a flowchart showing an example of a series of processing including determination processing and correction amount calculation processing of the memory system according to the second embodiment. FIG. 15 corresponds to FIG. 12 of the modification of the first embodiment.

In the example shown in FIG. 15, the condition for starting the determination processing is that the memory controller 30 issues a read command. The read command may be issued not only when a host read request is received but also when the read processing is executed in the internal processing determined by the memory controller 30. Therefore, the case of the read processing associated with the internal processing also includes a case where the memory controller 30 does not receive data read from the non-volatile memory 10 (does not transmit data read by the non-volatile memory 10 to the memory controller 30). The case of the read processing associated with the internal processing also includes a case where the memory controller 30 does not transmit data based on the data received from the non-volatile memory 10 to the host device 2.

As shown in FIG. 15, when the memory controller 30 issues a read command (Start), the memory controller 30 causes the non-volatile memory 10 to execute read processing on a read target cell unit CU (S41).

The non-volatile memory 10 executes the processing of reading from the read target cell unit CU. As described above, the non-volatile memory 10 may or may not transmit the read data to the memory controller 30 according to the issued read command. When the read data is not transmitted to the memory controller 30, the non-volatile memory 10 may notify the memory controller 30 that the read processing associated with the read command is completed.

When the read data is received from the non-volatile memory 10, the memory controller 30 temporarily stores the read data in the buffer memory 32. When the read request is received from the host device 2, the memory controller 30 transmits data based on the read data received from the non-volatile memory 10 to the host device 2.

When the processing of S41 is completed, the memory controller 30 decrements the number of remaining read operations of the read target physical block PBLK (S42).

Then, the memory controller 30 determines whether or not the number of remaining read operations of the read target physical block PBLK has become 0 through the decrement processing of S42 (S43).

If the number of remaining read operations of the read target physical block PBLK is not 0 (S43; no), the memory controller 30 determines that there is no correction target block. Thereby, the series of processing including the determination processing and the correction amount calculation processing will be finished (End).

If the number of remaining read operations of the read target physical block PBLK is 0 (S43; yes), the memory controller 30 determines that a physical block PBLK including the read target cell unit CU is a correction target block. The memory controller 30 then causes the non-volatile memory 10 to execute additional read processing on the read target cell unit CU (S44). When the memory controller 30 receives read data from the non-volatile memory 10 in the read processing of S41, the read processing of S44 is processing of reading at least one page different from the page read in the read processing of S41. When the memory controller 30 does not receive read data from the non-volatile memory 10 in the read processing of S41, the read processing of S44 is processing of reading all the pages of the read target cell unit CU. The memory controller 30 temporarily stores the read data received through the read processing of S44 in the buffer memory 32.

Based on the read data received through the read processing of S41 and S44, the memory controller 30 performs the correction amount calculation processing on the read target cell unit CU (S45). Thereby, the memory controller 30 calculates a correction amount of the read target cell unit CU.

The subsequent processing of S46 to S48 is the same as the processing of S35 to S37 in FIG. 12. Namely, when the correction amount calculation processing is completed, the memory controller 30 determines whether or not the read target cell unit CU is a representative cell unit CU (S46). If the read target cell unit CU is not a representative cell unit CU (S46; no), the memory controller 30 converts the correction amount calculated in the correction amount calculation processing of S45 into the representative correction amount $\Delta Va$ (S47). If the read target cell unit CU is a representative cell unit CU (S46; yes), the correction amount calculated in the correction amount calculation processing of S45 is the representative correction amount $\Delta Va$; therefore, the processing of S47 is omitted. After the processing of S47, the memory controller 30 stores the representative correction amount $\Delta Va$ calculated in the processing of S45 or S47 in the representative correction amount information 21 in the volatile memory 20 (S48). Thereby, the representative correction amount $\Delta Va$ of the correction target block is updated to an optimal state.

When the processing of S48 is completed, the series of processing including the determination processing and the correction amount calculation processing will be finished (End).

2.4. Advantageous Effects of Second Embodiment

According to the second embodiment, when the memory controller 30 issues a read command, the memory controller 30 starts a series of processing including the determination processing and the correction amount calculation processing. Thus, the memory controller 30 can select a physical block PBLK to be subjected to the correction amount calculation processing when determining that the correction amount calculation processing is executed.

On an additional note, the memory controller 30 may issue a read command as internal processing regardless of a host read request. For example, the memory controller 30 may cause the non-volatile memory 10 to periodically execute the read processing for the purpose of improving the stability of the read voltage. Since whether or not the data read through such periodical read processing has been read correctly is not an issue, said data is not transmitted to the memory controller 30 or the host device 2. On the other hand, the data read through the read processing associated with a host read request is required to be read correctly.

According to the second embodiment, the memory controller 30 decrements the number of remaining read operations corresponding to the read target physical block PBLK, in accordance with the execution of the read processing including the internal processing. The memory controller 30 then executes the correction amount calculation processing for the physical block PBLK in which the number of remaining read operations is 0. Therefore, the memory controller 30 can execute the correction amount calculation processing before receiving a host read request by utilizing the internal processing periodically executed on the valid block. Therefore, the read voltage can be maintained in an optimal state when receiving a host read request.

2.5. First Modification of Second Embodiment

In the second embodiment described above, a case where the correction amount calculation processing is executed on the physical block PBLK in which the number of read commands issued has reached a threshold is described; however, the embodiment is not limited thereto. For example, when an address of a read target matches a specific address, the correction amount calculation processing may be executed on the read target physical block PBLK.

FIG. 16 is a diagram showing the configuration of the memory management information of a memory system according to a first modification of the second embodiment. FIG. 16 corresponds to FIG. 13 of the second embodiment.

The memory management information 22 stores a designated address in addition to a valid flag. When the memory controller 30 issues a read command including a designated address, the memory controller 30 can execute the correction amount calculation processing for a physical block PBLK corresponding to the designated address.

In the example shown in FIG. 16, the designated address is indicated in the form of <x, y, z>, wherein x denotes a word line WLx, y denotes a string unit SUy, and z denotes an upper page U or a lower page L. Namely, in the example shown in FIG. 16, when a read command to read the upper page of a cell unit CU corresponding to a set including the word line WL2 and the string unit SU0 in the physical block PBLK0 is issued, the physical block PBLK0 will be a correction target block. When a read command to read the lower page of a cell unit CU corresponding to a set including the word line WL5 and the string unit SU2 in the physical block PBLK1 is issued, the physical block PBLK1 will be a correction target block. When a read command to read the lower page of a cell unit CU corresponding to a set including the word line WL0 and the string unit SU3 in the physical block PBLK2 is issued, the physical block PBLK2 will be a correction target block. When a read command to read the upper page of a cell unit CU corresponding to a set including the word line WL7 and the string unit SU1 in the physical block PBLK3 is issued, the physical block PBLK3 will be a correction target block.

Figure 17:
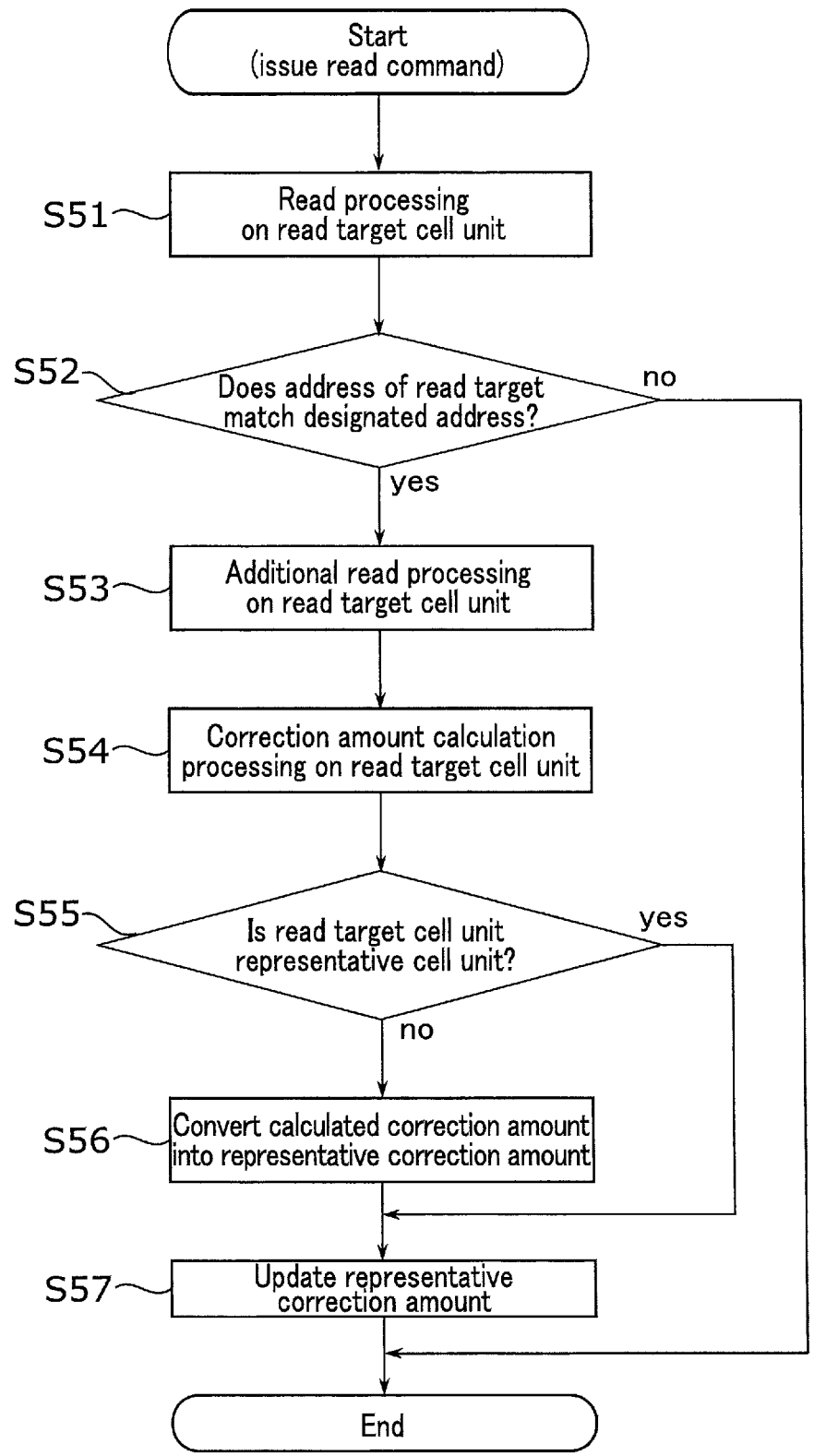
FIG. 17 is a flowchart showing an example of a series of processing including determination processing and correction amount calculation processing of the memory system according to the first modification of the second embodiment.

FIG. 17 is a flowchart showing an example of a series of processing including determination processing and correction amount calculation processing of a memory system according to the first modification of the second embodiment. FIG. 17 corresponds to FIG. 15 of the second embodiment.

In the example shown in FIG. 17, the condition for starting the determination processing is that the memory controller 30 issues a read command, as in the case shown in FIG. 15.

The processing of S51 in FIG. 17 is the same as the processing of S41 in FIG. 15. Namely, when the memory controller 30 issues a read command (Start), the memory controller 30 causes the non-volatile memory 10 to execute read processing on a read target cell unit CU (S51). The non-volatile memory 10 may or may not transmit read data to the memory controller 30 in accordance with the issued read command. When the read data is received from the non-volatile memory 10, the memory controller 30 temporarily stores the read data in the buffer memory 32.

When the processing of S51 is completed, the memory controller 30 determines whether or not an address of a read target included in a read command matches a designated address (S52).

If an address of a read target included in a read command does not match a designated address (S52; no), the memory controller 30 determines that there is no correction target block. Thereby, the series of processing including the determination processing and the correction amount calculation processing will be finished (End).

If an address of a read target included in a read command matches a designated address (S52; yes), the memory controller 30 determines that a physical block PBLK including a read target cell unit CU is a correction target block. The memory controller 30 then causes the non-volatile memory 10 to execute additional read processing on the read target cell unit CU (S53). When the memory controller 30 receives read data from the non-volatile memory 10 in the read processing of S51, the read processing of S53 is processing of reading at least one page different from the page read in the read processing of S51. When the memory controller 30 does not receive read data from the non-volatile memory 10 in the read processing of S51, the read processing of S53 is processing of reading all the pages of the read target cell unit CU. The memory controller 30 temporarily stores the read data received through the read processing of S53 in the buffer memory 32.

The subsequent processing of S54 to S57 is the same as the processing of S45 to S48 in FIG. 15. Namely, based on the read data received through the read processing of S51 and S53, the memory controller 30 performs the correction amount calculation processing on the read target cell unit CU (S54). When the correction amount calculation processing is completed, the memory controller 30 determines whether or not the read target cell unit CU is a representative cell unit CU (S55). If the read target cell unit CU is not a representative cell unit CU (S55; no), the memory controller 30 converts the correction amount calculated in the correction amount calculation processing of S54 into the representative correction amount $\Delta Va$ (S56). If the read target cell unit CU is a representative cell unit CU (S55; yes), the correction amount calculated in the correction amount calculation processing of S54 is the representative correction amount $\Delta Va$; therefore, the processing of S56 is omitted. After the processing of S56, the memory controller 30 stores the representative correction amount $\Delta Va$ calculated in the processing of S54 or S56 in the representative correction amount information 21 in the volatile memory 20 (S57). Thereby, the representative correction amount $\Delta Va$ of the correction target block is updated to an optimal state.

When the processing of S57 is completed, the series of processing including the determination processing and the correction amount calculation processing will be finished (End).

According to the first modification of the second embodiment, when an address included in a read command matches a designated address, the memory controller 30 executes the correction amount calculation processing for a physical block PBLK corresponding to the designated address. Therefore, the memory controller 30 can execute the correction amount calculation processing before receiving a host read request by utilizing the internal processing periodically executed on the valid block. Accordingly, the read voltage can be maintained in an optimal state when receiving a host read request.

On an additional note, since the memory controller 30 determines whether or not data can be read correctly in the internal processing, the memory controller 30 may execute the read processing (i.e., patrol read processing) of patrolling all the pages in the non-volatile memory 10.

FIG. 18 is a schematic diagram showing an example of a timing of executing the patrol read processing and the correction amount calculation processing of the memory system according to the first modification of the second embodiment. In FIG. 18, the order of executing the patrol read processing is indicated by numbers. Also, in FIG. 18, designated addresses based on the memory management information 22 in FIG. 16 are hatched.

In the example shown in FIG. 18, the memory controller 30 selects, as pages to be patrolled first, an address <0, 0, L> for all the physical blocks PBLK, and executes the patrol read processing. The memory controller 30 then selects an address <0, 1, L> for all the physical blocks PBLK as pages to be patrolled secondly, and executes the patrol read processing. When patrolling the pages through the patrol read processing in such an order, the addresses of the pages patrolled fourth, twenty-third, forty-first, and sixty-second match the designated addresses of the physical blocks PBLK2, PBLK1, PBLK0, and PBLK3, respectively.

As described above, according to the first modification of the second embodiment, independently setting a designated address for each physical block PBLK makes it possible to independently set the timing when an address subjected to patrol read processing matches a designated address (i.e., the timing of executing the correction amount calculation processing). This makes it possible to deconcentrate the timing of executing the correction amount calculation processing so that it does not concentrate in a specific period, while executing the correction amount calculation processing for all the physical blocks PBLK. Therefore, an increase in the load of the memory controller 30 associated with the correction amount calculation processing can be suppressed.

2.6. Second Modification of Second Embodiment

In the first modification of the second embodiment, a case where the unit of executing the patrol read processing is a physical block PBLK is described; however, the modification is not limited thereto. For example, the unit of executing the patrol read processing may be a plurality of physical blocks PBLK.

Figure 19:
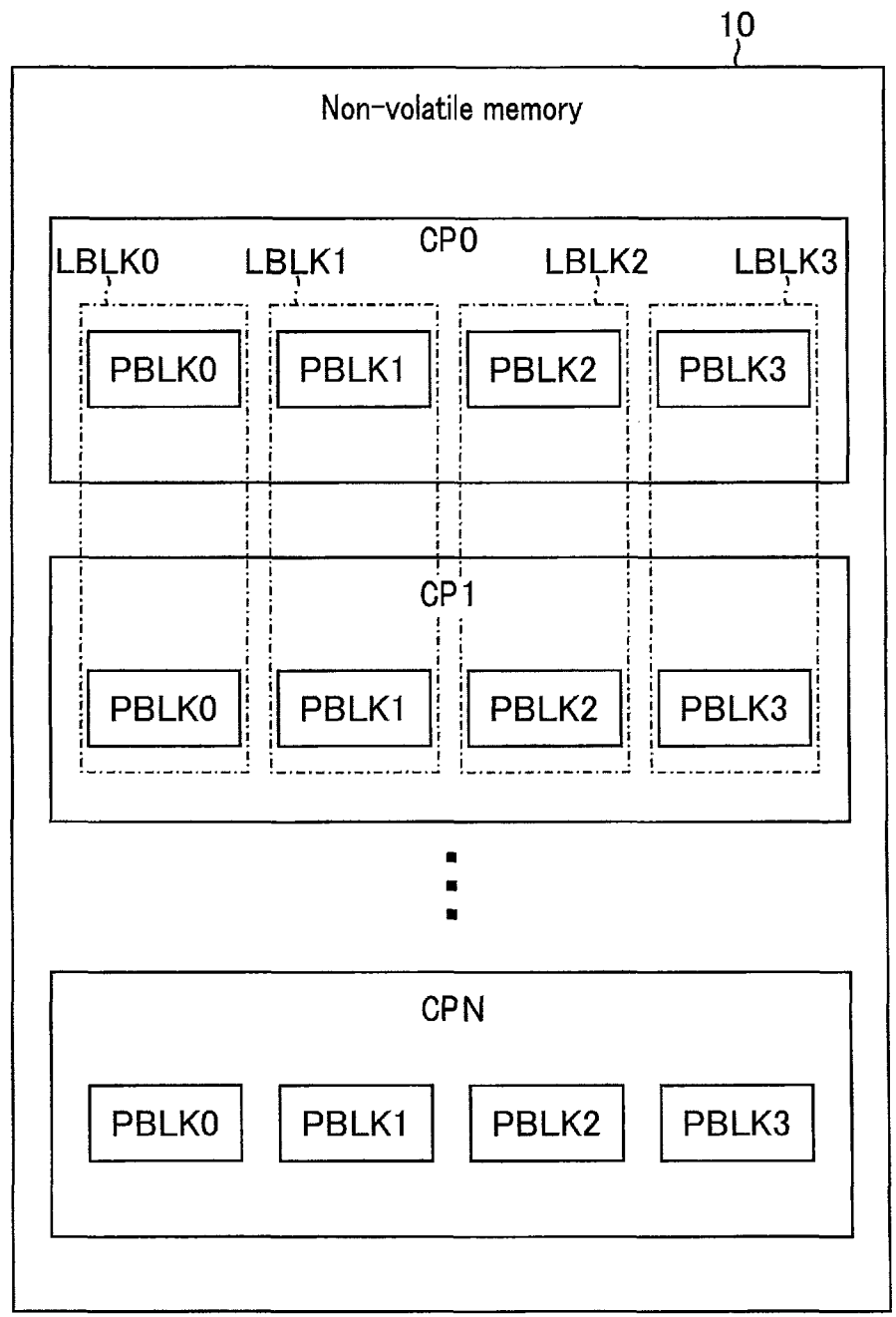
FIG. 19 is a block diagram showing an example of a configuration of a non-volatile memory according to a second modification of the second embodiment.

FIG. 19 is a block diagram showing an example of a configuration of a non-volatile memory according to a second modification of the second embodiment. FIG. 19 corresponds to FIG. 3 of the first embodiment.

As shown in FIG. 19, the non-volatile memory 10 may include a plurality of logical blocks LBLK (LBLK0, LBLK1, LBLK2, LBLK3, . . . ). Each logical block LBLK includes a plurality of physical blocks PBLK. A plurality of physical blocks PBLK included in a logical block LBLK may belong to different chips CP.

In the example shown in FIG. 19, the logical block LBLK0 includes the physical block PBLK0 of the chip CP0 and the physical block PBLK0 of the chip CP1. The logical block LBLK1 includes the physical block PBLK1 of the chip CP0 and the physical block PBLK1 of the chip CP1. The logical block LBLK2 includes the physical block PBLK2 of the chip CP0 and the physical block PBLK2 of the chip CP1. The logical block LBLK3 includes the physical block PBLK3 of the chip CP0 and the physical block PBLK3 of the chip CP1.

The memory controller 30 may execute various types of processing such as the write processing and the read processing in units of logical blocks LBLK. When the processing is to be executed in units of logical blocks LBLK, the memory controller 30 may execute the processing in parallel on the plurality of physical blocks PBLK in a logical block LBLK. The units in which the memory controller 30 executes various types of processing are not limited to logical blocks LBLK; the memory controller 30 may also execute various types of processing in units of physical blocks PBLK.

FIG. 20 is a diagram showing the configuration of the memory management information of the memory system according to the second modification of the second embodiment. FIG. 20 corresponds to FIG. 16 of the second embodiment. FIG. 20 shows a case where valid flags are stored in units of logical blocks LBLK, and designated addresses are stored in units of physical blocks PBLK.

Specifically, a designated address of the physical block PBLK0 of the chip CP0 included in the logical block LBLK0, and a designated address of the physical block PBLK0 of the chip CP1 included in the logical block LBLK0 are <2, 0, U> and <2, 0, L>, respectively. A designated address of the physical block PBLK1 of the chip CP0 included in the logical block LBLK1, and a designated address of the physical block PBLK1 of the chip CP1 included in the logical block LBLK1 are <5, 2, L> and <5, 2, U>, respectively. A designated address of the physical block PBLK2 of the chip CP0 included in the logical block LBLK2, and a designated address of the physical block PBLK2 of the chip CP1 included in the logical block LBLK2 are <0, 3, L> and <0, 3, U>, respectively. A designated address of the physical block PBLK3 of the chip CP0 included in the logical block LBLK3, and a designated address of the physical block PBLK3 of the chip CP1 included in the logical block LBLK3 are <7, 1, U> and <7, 1, L>, respectively.

FIG. 21 is a schematic diagram showing an example of a timing of executing the patrol read processing and the correction amount calculation processing of the memory system according to the second modification of the second embodiment. FIG. 21 corresponds to FIG. 18 of the first modification of the second embodiment.

In the example shown in FIG. 21, an address of a page patrolled fourth matches the designated address of the physical block PBLK2 of the chip CP0. An address of a page patrolled ninth matches the designated address of the physical block PBLK0 of the chip CP1. An address of a page patrolled twenty-third matches the designated address of the physical block PBLK1 of the chip CP0. An address of a page patrolled thirtieth matches the designated address of the physical block PBLK3 of the chip CP1. An address of a page patrolled thirty-sixth matches the designated address of the physical block PBLK2 of the chip CP1. An address of a page patrolled forty-first matches the designated address of the physical block PBLK0 of the chip CP0. An address of a page patrolled fifty-fifth matches the designated address of the physical block PBLK1 of the chip CP1. An address of a page patrolled sixty-second matches the designated address of the physical block PBLK3 of the chip CP0.

As described above, according to the second modification of the second embodiment, even when the patrol read processing is executed in the units of logical blocks LBLK, designated addresses are independently set for each physical block PBLK. Thus, it is possible to independently set, for each physical block PBLK, the timing when an address subjected to patrol read processing matches a designated address (i.e., the timing of executing the correction amount calculation processing). Accordingly, the timing of executing the correction amount calculation processing of a plurality of physical blocks PBLK included in the same logical block LBLK can be deconcentrated so that it does not concentrate in a specific period. Therefore, an increase in the load of the memory controller 30 associated with the correction amount calculation processing can be suppressed.

3. Third Embodiment

Next, a memory system according to a third embodiment will be described. The third embodiment is the same as the first embodiment in that the pointer ptr pointing to a correction target block is defined. On the other hand, the third embodiment is different from the first embodiment in that the condition for starting the determination processing is not limited to reception of a host read request but may be reception of any host request. The description below omits descriptions of the same configurations and operations as those of the first embodiment, and mainly the configurations and operations differing from those of the first embodiment will be described.

3.1. Determination Processing and Correction Amount Calculation Processing

Figure 22:
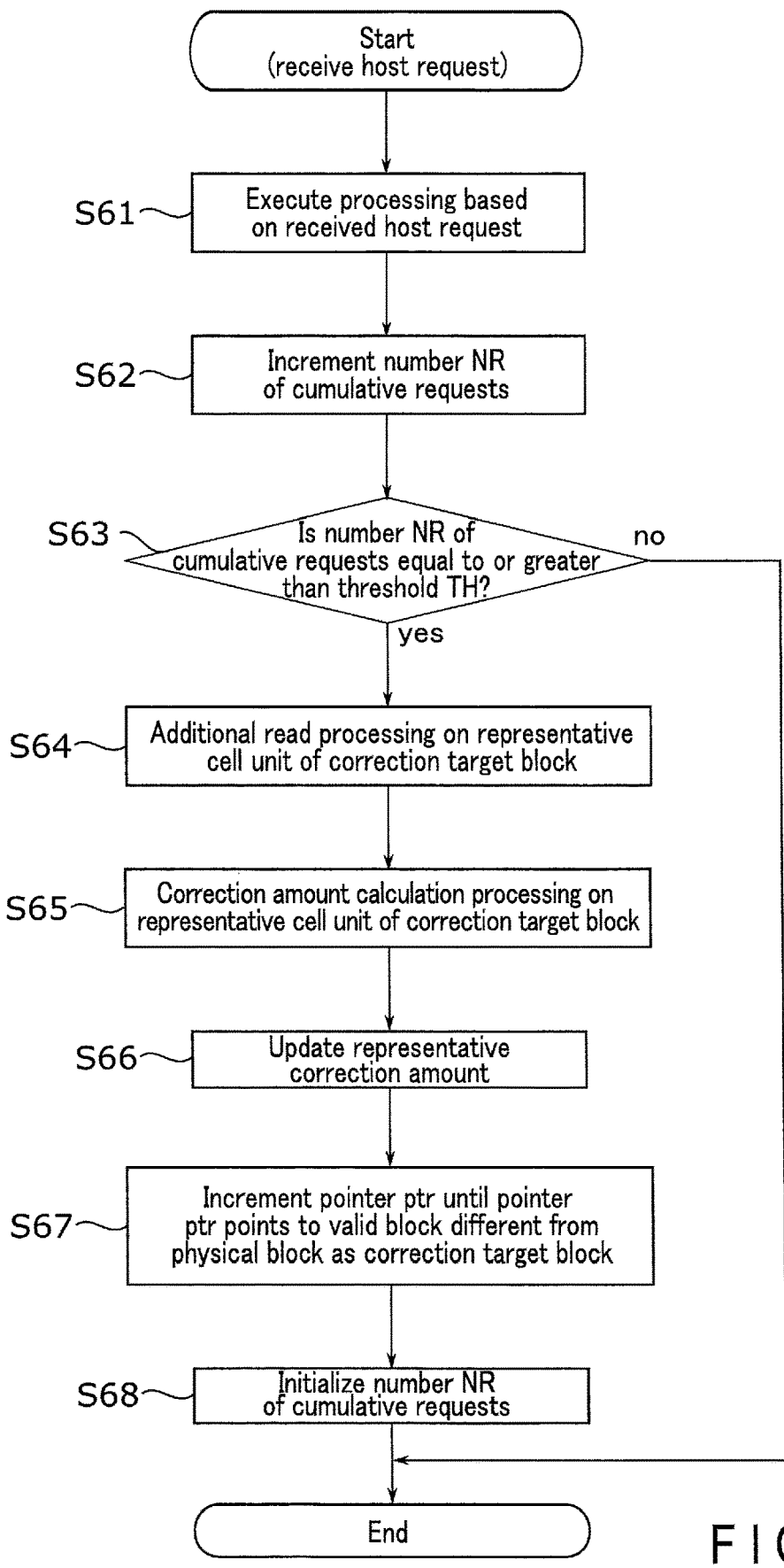
FIG. 22 is a flowchart showing an example of a series of processing including determination processing and correction amount calculation processing of a memory system according to a third embodiment.

FIG. 22 is a flowchart showing an example of a series of processing including determination processing and correction amount calculation processing of the memory system according to the third embodiment. FIG. 22 corresponds to FIG. 12 of the modification of the first embodiment.

In the example shown in FIG. 22, the condition for starting the determination processing is that the memory controller 30 receives a host request. The host request includes not only a host read request but also any request from the host device 2.

As shown in FIG. 22, when the memory controller 30 receives a host request (Start), the memory controller 30 executes processing based on the received host request (S61). When the host request is a host read request, for example, the processing of S61 is the same as the processing of S31 in FIG. 12.

When the processing of S61 is completed, the memory controller 30 increments the number NR of cumulative requests (S62). The number NR of cumulative requests is, for example, an integer of 0 or more, which becomes 0 when initialized.

The memory controller 30 determines whether or not the number NR of cumulative requests incremented through the processing of S62 is equal to or greater than a threshold TH (S63).

If the number NR of cumulative requests is not equal to or greater than a threshold TH (S63; no), the series of processing including the determination processing and the correction amount calculation processing will be finished (End). If the number NR of cumulative requests is equal to or greater than a threshold TH (S63; yes), it is determined that a representative cell unit CU of a correction target block pointed to by the pointer ptr is a read target cell unit CU. The memory controller 30 then causes the non-volatile memory 10 to execute additional read processing on the representative cell unit CU of the correction target block (S64).

When the processing of S61 is read processing on the representative cell unit CU of the correction target block, the read processing of S64 is processing of reading at least one page different from the page read in the read processing of S61. When the processing of S61 is processing other than read processing or read processing on a cell unit CU other than the representative cell unit CU of the correction target block, the read processing of S64 is processing of reading all the pages of the representative cell unit CU of the correction target block. The memory controller 30 temporarily stores the read data received through the read processing of S64 in the buffer memory 32.

Based on the read data received through the read processing of S61 and S64, the memory controller 30 performs the correction amount calculation processing on the representative cell unit CU of the correction target block (S65).

Thereby, the memory controller 30 calculates the representative correction amount ΔVa of the correction target block.

The memory controller 30 stores the representative correction amount ΔVa calculated in the processing of S65 in the representative correction amount information 21 in the volatile memory 20 (S66). Thereby, the representative correction amount ΔVa of the correction target block is updated to an optimal state.

The memory controller 30 refers to the memory management information 22 and increments the pointer ptr until the pointer ptr points to a valid block different from the physical block PBLK as a correction target block (S67). Thus, a correction target block in the next series of processing including the correction amount calculation processing will be a physical block PBLK different from the correction target block in the current series of processing including the correction amount calculation processing.

The memory controller 30 initializes the number NR of cumulative requests to 0 (S68). Thereby, the correction amount calculation processing for the next correction target block is performed after a host request whose number NR of cumulative requests is at least equal to or greater than a threshold TH is received.

When the processing of S68 is completed, the series of processing including the determination processing and the correction amount calculation processing will be finished (End).

3.2. Advantageous Effects of Third Embodiment

According to the third embodiment, when the memory controller 30 receives a host request, the memory controller 30 starts a series of processing including the determination processing and the correction amount calculation processing. When the number NR of cumulative requests of the host request is equal to or greater than a threshold TH, the memory controller 30 executes the correction amount calculation processing for a correction target block which is pointed to by the pointer ptr. Thus, the representative correction amount ΔVa of the correction target block can be maintained in an optimal state.

After the correction amount calculation processing, the memory controller 30 increments the pointer ptr until the pointer ptr points to a valid block different from the physical block PBLK as a correction target block. Thus, correction target blocks can be patrolled so that the correction amount calculation processing for all the valid blocks will be executed at a similar frequency. Therefore, an increase in the management load of the read voltage can be suppressed.

4. Fourth Embodiment

Next, a memory system according to a fourth embodiment will be described. The fourth embodiment is the same as the first embodiment in that the pointer ptr pointing to a correction target block is defined. On the other hand, the fourth embodiment is different from the first embodiment in that the condition for starting the determination processing is that the state of the memory system 3 starts to transition. The description below omits descriptions of the same configurations and operations as those of the first embodiment, and mainly the configurations and operations differing from those of the first embodiment will be described.

4.1. Determination Processing and Correction Amount Calculation Processing

FIG. 23 is a state transition diagram showing an example of a state transition associated with determination processing and correction amount calculation processing of the memory system according to the fourth embodiment. FIG. 23 shows a relationship among multiple states that the memory system 3 may have with respect to the determination processing and the correction amount calculation processing.

The states that the memory system 3 may have will be described first.

As shown in FIG. 23, the states of the memory system 3 related to the determination processing and the correction amount calculation processing include an active state STS1, a transitioning-between-active-and-standby state STS2, a standby state STS3, a transitioning-between-active-and-power-off state STS4, and a power-off state STS5. The active state STS1 is a state in which all the functions of the memory system 3 are valid. In the first to third embodiments described above, the memory system 3 is in the active state STS1. The transitioning-between-active-and-standby state STS2 is a state in which the memory system 3 is transitioning between the active state and the standby state. The standby state STS3 is a state in which some of the functions of the memory system 3 are deactivated. The power consumption of the memory system 3 in the standby state STS3 is smaller than the power consumption of the memory system 3 in the active state STS1. The transitioning-between-active-and-power-off state STS4 is a state in which the memory system 3 is transitioning between the active state and the power-off state. The power-off state STS5 is a state in which power supply to the memory system 3 is stopped. In the power-off state STS5, the memory system 3 does not consume power.

The transitioning-between-active-and-standby state STS2 includes a correction-amount-calculation-processing state STS21, a standby-transition-processing state STS22, an active-return-processing state STS23, and a correction-target-block-updating state STS24. The correction-amount-calculation-processing state STS21 is a state in which the memory system 3 is executing the correction amount calculation processing. The standby-transition-processing state STS22 is a state in which the memory system 3 is executing processing for transitioning from the active state STS1 to the standby state STS3. The active-return-processing state STS23 is a state in which the memory system 3 is executing processing for returning from the standby state STS3 to the active state STS1. The correction-target-block-updating state STS24 is a state in which the memory system 3 is incrementing the pointer ptr in the memory management information 22 to update a correction target block.

The transitioning-between-active-and-power-off state STS4 includes a correction-amount-calculation-processing state STS41, a power-off-transition-processing state STS42, an active-return-processing state STS43, and a correction-target-block-updating state STS44. The power-off-transition-processing state STS42 is a state in which the memory system 3 is executing processing for transitioning from the active state STS1 to the power-off state STS5. The active-return-processing state STS43 is a state in which the memory system 3 is executing processing for returning from the power-off state STS5 to the active state STS1. The correction-amount-calculation-processing state STS41 and the correction-target-block-updating state STS44 are the same states as the correction-amount-calculation-processing state STS21 and the correction-target-block-updating state STS24, respectively.

Next, an event for causing the respective states to transition will be described.

When the standby entry condition is satisfied in the active state STS1 (E1), the memory controller 30 determines to execute the correction amount calculation processing, and starts executing the correction amount calculation processing. Thereby, the memory system 3 starts transitioning from the active state STS1 to the standby state STS3. Namely, the memory system 3 transitions to the correction-amount-calculation-processing state STS21. The standby entry condition is assumed to be, for example, a case where a period of not receiving a host request from the host device 2 is equal to or longer than a designated period.

When the correction amount calculation processing is completed in the correction-amount-calculation-processing state STS21 (E2), the memory system 3 transitions to the standby-transition-processing state STS22. The standby transition processing includes processing of stopping some of the functions of the memory system 3. The standby transition processing may include processing of storing, in the non-volatile memory 10, information that is lost due to a transition to the standby state STS3 among the information stored in the volatile memory 20, to thereby make the information non-volatile. For example, the information that is made non-volatile in the standby transition processing may include the representative correction amount information 21 and the memory management information 22. When the standby transition processing is completed in the standby-transition-processing state STS22 (E3), the memory system 3 transitions to the standby state STS3. Through the above process, a transition from the active state STS1 to the standby state STS3 is finished.

When the standby exit condition is satisfied in the standby state STS3 (E4), the memory system 3 starts transitioning from the standby state STS3 to the active state STS1. Namely, the memory system 3 transitions to the active-return-processing state STS23. The standby exit condition is assumed to be, for example, a case where the memory system 3 receives a new host request from the host device 2. The active return processing in the active-return-processing state STS23 includes processing of restoring some of the functions of the memory system 3 that have been stopped. The active return processing in the active-return-processing state STS23 may include processing of storing the information made non-volatile in the standby transition processing in the volatile memory 20 again. For example, the information stored in the volatile memory 20 in the active return processing in the active-return-processing state STS23 may include the representative correction amount information 21 and the memory management information 22. When the active return processing is completed in the active-return-processing state STS23 (E5), the memory system 3 transitions to the correction-target-block-updating state STS24. When the update of the correction target block is completed in the correction-target-block-updating state STS24 (E6), the memory system 3 transitions to the active state STS1. Through the above process, a transition from the standby state STS3 to the active state STS1 is finished.

When the power-off entry condition is satisfied in the active state STS1 (E7), the memory controller 30 determines to execute the correction amount calculation processing, and starts executing the correction amount calculation processing. Thereby, the memory system 3 starts transitioning from the active state STS1 to the power-off state STS5. Namely, the memory system 3 transitions to the correction-amount-calculation-processing state STS41. The power-off entry condition is assumed to be, for example, a case where power supply to the memory system 3 is stopped.

If there is an allowance time in the correction-amount-calculation-processing state STS41 (E8), the memory system 3 maintains the correction-amount-calculation-processing state STS41. Namely, the memory system 3 continues to execute the correction amount calculation processing for one or more correction target blocks in a range that allows for a transition to the power-off state STS5 in accordance with the internal capacity (not shown). If there is no allowance time in the correction-amount-calculation-processing state STS41 (E9), the memory system 3 transitions to the power-off-transition-processing state STS42. The power-off transition processing includes processing of storing, in the non-volatile memory 10, at least some of the information stored in the volatile memory 20 using the internal capacity of the memory system 3, to thereby make the information non-volatile. For example, the information that is made non-volatile in the power-off transition processing may include the representative correction amount information 21 and the memory management information 22. When the power-off transition processing is completed in the power-off-transition-processing state STS42 (E10), the memory system 3 transitions to the power-off state STS5. Through the above process, a transition from the active state STS1 to the power-off state STS5 is finished.

When the power-off exit condition is satisfied in the power-off state STS5 (E11), the memory system 3 starts transitioning from the power-off state STS5 to the active state STS1. Namely, the memory system 3 transitions to the active-return-processing state STS43. The power-off exit condition is assumed to be, for example, a case where power supply to the memory system 3 that has been stopped is resumed. The active return processing in the active-return-processing state STS43 includes processing of restoring the functions of the memory system 3 that have been stopped. The active return processing in the active-return-processing state STS43 may include processing of storing the information made non-volatile in the power-off transition processing in the volatile memory 20 again. For example, the information stored in the volatile memory 20 in the active return processing in the active-return-processing state STS43 may include the representative correction amount information 21 and the memory management information 22. When the active return processing is completed in the active-return-processing state STS43 (E12), the memory system 3 transitions to the correction-target-block-updating state STS44. When the update of the correction target block is completed in the correction-target-block-updating state STS44 (E13), the memory system 3 transitions to the active state STS1. Through the above process, a transition from the power-off state STS5 to the active state STS1 is finished.

4.2. Advantageous Effects of Fourth Embodiment

According to the fourth embodiment, when the standby entry condition is satisfied, the memory controller 30 executes the correction amount calculation processing before executing the standby transition processing. Thus, even in a period of not frequently receiving a request from the host device 2, the representative correction amount ΔVa of the correction target block can be maintained in an optimal state.

Also, when the power-off entry condition is satisfied, the memory controller 30 executes the correction amount calculation processing before executing the power-off transition processing. Thus, when power supply to the memory system 3 is resumed, the representative correction amount ΔVa of the correction target block can be maintained in an optimal state.

In addition, the memory controller 30 executes the correction amount calculation processing for one or more correction target blocks in a range where there is an allowance time based on the internal capacity. Thus, when power supply to the memory system 3 is resumed, it is possible to increase the number of correction target blocks whose representative correction amount ΔVa is maintained in an optimal state.

Furthermore, when the standby exit condition or the power-off exit condition is satisfied, the memory controller 30 increments the pointer ptr, after executing the active return processing, until the pointer ptr points to a valid block different from the physical block PBLK as a correction target block. Thus, correction target blocks can be patrolled so that a physical block PBLK on which the correction amount calculation processing was not executed in tandem with the state transition will be the next correction target block. Therefore, an increase in the management load of the read voltage can be suppressed.

4.3. Modifications of Fourth Embodiment

In the fourth embodiment described above, a case where the correction amount calculation processing is executed before the memory system 3 transitions to the standby state STS3 and before the memory system 3 transitions to the power-off state STS5 is shown; however, the embodiment is not limited thereto. For example, the correction amount calculation processing may be executed before the memory system 3 transitions to the active state STS1.

FIG. 24 is a state transition diagram showing an example of a state transition associated with determination processing and correction amount calculation processing of a memory system according to a modification of the fourth embodiment. FIG. 24 corresponds to FIG. 23 of the fourth embodiment.

As shown in FIG. 24, when the standby entry condition is satisfied in the active state STS1 (E1), the memory system 3 starts transitioning from the active state STS1 to the standby state STS3. Namely, the memory system 3 transitions to the standby-transition-processing state STS22. When the standby transition processing is completed in the standby-transition-processing state STS22 (E3), the memory system 3 transitions to the standby state STS3. Through the above process, a transition from the active state STS1 to the standby state STS3 is finished.

When the standby exit condition is satisfied in the standby state STS3 (E4), the memory system 3 starts transitioning from the standby state STS3 to the active state STS1. Namely, the memory system 3 transitions to the active-return-processing state STS23. When the active return processing is completed in the active-return-processing state STS23 (E5), the memory controller 30 determines to execute the correction amount calculation processing, and starts executing the correction amount calculation processing. Thereby, the memory system 3 transitions to the correction-amount-calculation-processing state STS21. When the correction amount calculation processing is completed in the correction-amount-calculation-processing state STS21 (E2), the memory system 3 transitions to the correction-target-block-updating state STS24. When the update of the correction target block is completed in the correction-target-block-updating state STS24 (E6), the memory system 3 transitions to the active state STS1. Through the above process, a transition from the standby state STS3 to the active state STS1 is finished.

Also, when the power-off entry condition is satisfied in the active state STS1 (E7), the memory system 3 starts transitioning from the active state STS1 to the power-off state STS5. Namely, the memory system 3 transitions to the power-off-transition-processing state STS42. When the power-off transition processing is completed in the power-off-transition-processing state STS42 (E10), the memory system 3 transitions to the power-off state STS5. Through the above process, a transition from the active state STS1 to the power-off state STS5 is finished.

When the power-off exit condition is satisfied in the power-off state STS5 (E11), the memory system 3 starts transitioning from the power-off state STS5 to the active state STS1. Namely, the memory system 3 transitions to the active-return-processing state STS43. When the active return processing is completed in the active-return-processing state STS43 (E12), the memory controller 30 determines to execute the correction amount calculation processing, and starts executing the correction amount calculation processing. Thereby, the memory system 3 transitions to the correction-amount-calculation-processing state STS41. When the correction amount calculation processing is completed in the correction-amount-calculation-processing state STS41 (E9A), the memory system 3 transitions to the correction-target-block-updating state STS44. When the update of the correction target block is completed in the correction-target-block-updating state STS44 (E13), the memory system 3 transitions to the active state STS1. Through the above process, a transition from the power-off state STS5 to the active state STS1 is finished.

According to the modification of the fourth embodiment, when the standby exit condition is satisfied, the memory controller 30 executes the correction amount calculation processing after executing the active return processing. When the power-off exit condition is satisfied, the memory controller 30 executes the correction amount calculation processing after executing the active return processing. Thus, it is possible to suppress the influence of the fluctuation of the read voltage that may occur due to a transition to the standby state STS3 and the power-off state STS5.

The memory controller 30 does not execute the correction amount calculation processing multiple times in the transitioning-between-active-and-power-off state STS4. Thus, the memory system 3 can promptly transition from the power-off state STS5 to the active state STS1.

5. Fifth Embodiment

Next, a memory system according to a fifth embodiment will be described. The fifth embodiment is different from the fourth embodiment in that the frequency at which the correction amount calculation processing is executed on a correction target block is changed according to the number of times the correction amount calculation processing has been executed. The description below omits descriptions of the same configurations and operations as those of the fourth embodiment, and mainly the configurations and operations differing from those of the fourth embodiment will be described.

5.1. Memory Management Information

FIG. 25 is a diagram showing the configuration of the memory management information of the memory system according to the fifth embodiment. FIG. 25 corresponds to FIG. 8 of the first embodiment. As shown in FIG. 25, the memory management information 22 stores the number of corrections in addition to a valid flag. The number of corrections indicates the number of times the correction amount calculation processing has been executed for a corresponding physical block PBLK.

In the memory management information 22 according to the fifth embodiment, the physical blocks PBLK in the non-volatile memory 10 are grouped into a plurality of lists according to the valid flag and the number of corrections described above. The example in FIG. 25 shows a case where the memory management information 22 is classified into four lists. Specifically, the memory management information 22 is classified into a not-written list, an uncorrected list, a small-number-of-corrections list, and a large-number-of-corrections list.

In the not-written list, the physical blocks PBLK in which valid data are not written, that is, in which the valid flag is "false", are grouped. The physical blocks PBLK grouped into the not-written list are not correction target blocks. Therefore, the physical blocks PBLK grouped into the not-written list will not be pointed to by a pointer.

In the uncorrected list, the physical blocks PBLK whose number of corrections is 0 among valid blocks, that is, among the physical blocks PBLK in which the valid flag is "true", are grouped. The physical blocks PBLK grouped into the uncorrected list become correction target blocks when pointed to by a pointer ptr1.

In the small-number-of-corrections list, the physical blocks PBLK whose number of corrections is 1 or more and less than a threshold X among valid blocks are grouped. The threshold X is an integer of 2 or greater. The example in FIG. 25 shows a case where the threshold X is 5. The physical blocks PBLK grouped into the small-number-of-corrections list become correction target blocks when pointed to by a pointer ptr2 different from the pointer ptr1.

In the large-number-of-corrections list, the physical blocks PBLK whose number of corrections is equal to or greater than the threshold X among valid blocks are grouped. The physical blocks PBLK grouped into the large-number-of-corrections list become correction target blocks when pointed to by a pointer ptr3 different from the pointers ptr1 and ptr2.

The pointers ptr1 to ptr3 are independently defined. The frequency at which the pointer ptr1 is incremented is higher than the frequency at which the pointers ptr2 and ptr3 are incremented. The frequency at which the pointer ptr2 is incremented is higher than the frequency at which the pointer ptr3 is incremented. Therefore, the physical blocks PBLK grouped into the uncorrected list become correction target blocks at a higher frequency than the frequency at which the physical blocks PBLK grouped into the small-number-of-corrections list and the physical blocks PBLK grouped into the large-number-of-corrections list become correction target blocks. The physical blocks PBLK grouped into the small-number-of-corrections list become correction target blocks at a higher frequency than the frequency at which the physical blocks PBLK grouped into the large-number-of-corrections list become correction target blocks. In this manner, in the memory management information 22 according to the fifth embodiment, the physical blocks PBLK are grouped so that the frequency at which the physical blocks PBLK become physical blocks to be subjected to the correction amount calculation processing decreases as the number of corrections increases.

5.2. Write Processing

Figure 26:
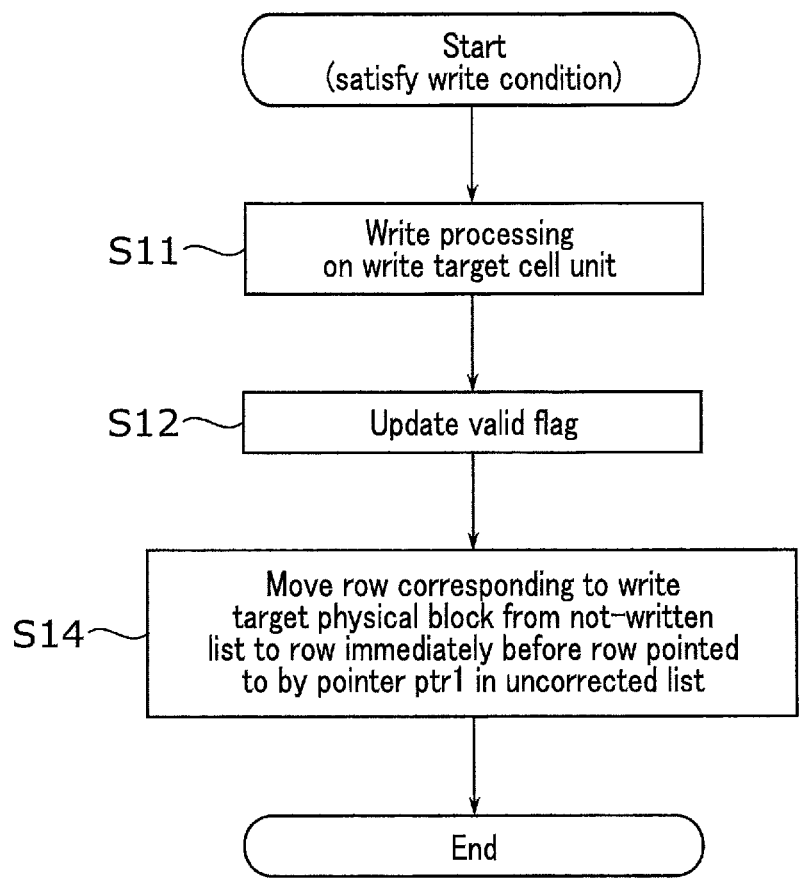
FIG. 26 is a flowchart showing an example of a series of processing including write processing of the memory system according to the fifth embodiment.

FIG. 26 is a flowchart showing an example of a series of processing including write processing of the memory system according to the fifth embodiment. In FIG. 26, processing S14 is further added to the process shown in FIG. 10 of the first embodiment.

The processing of S11 and S12 in FIG. 26 is the same as the processing of S11 and S12 in FIG. 10. Namely, when the write condition is satisfied ("Start"), the memory controller 30 causes the non-volatile memory 10 to execute write processing on a write target cell unit CU (S11). When the write processing of S11 is completed, the memory controller 30 updates the valid flag in the memory management information 22 (S12).

When the processing of S12 is completed, the memory controller 30 deletes a row corresponding to a write target physical block PBLK from the not-written list and moves it to a row immediately before the row pointed to by the pointer ptr1 in the uncorrected list (S14). Thus, the memory controller 30 can execute the correction amount calculation processing on the physical block PBLK into which data has been written, lastly in the current uncorrected list.

When the processing of S14 is completed, the series of processing including the write processing will be finished (End).

5.3. Determination Processing and Correction Amount Calculation Processing

FIG. 27 is a state transition diagram showing an example of a state transition associated with determination processing and correction amount calculation processing of the memory system according to the fifth embodiment.
FIG. 27 corresponds to FIG. 23 of the fourth embodiment. As shown in FIG. 27, the memory system 3 includes an active state STS1, a plurality of transitioning states STS2A to STS2C, and a plurality of standby states STS3A to STS3C.

The standby A state STS3A is, for example, a standby state that enables the smallest power consumption. Specifically, the memory system 3 in the standby A state STS3A, for example, stops power supply to the non-volatile memory 10. The amount of information that the memory system 3 continues to store in the volatile memory 20 in the standby A state STS3A is smaller than the respective amounts in the standby B state STS3B and the standby C state STS3C. The memory system 3 in the standby A state STS3A stops communications of clock signals except the clock signals communicated between the memory system 3 and the host device 2.

The standby B state STS3B is, for example, a standby state having characteristics intermediate between the standby A state STS3A and the standby C state STS3C. Specifically, the memory system 3 in the standby B state STS3B, for example, maintains power supply to the non-volatile memory 10. The amount of information that the memory system 3 continues to store in the volatile memory 20 in the standby B state STS3B is larger than that in the standby A state STS3A and smaller than that in the standby C state STS3C. The memory system 3 in the standby B state STS3B stops communications of clock signals except the clock signals communicated between the memory system 3 and the host device 2.

The standby C state STS3C is, for example, a standby state that allows the time of returning to the active state STS1 to be shortest. Specifically, the memory system 3 in the standby C state STS3C, for example, does not stop power supply. The amount of information that the memory system 3 continues to store in the volatile memory 20 in the standby C state STS3C is larger than the respective amounts in the standby A state STS3A and the standby B state STS3B. The memory system 3 in the standby C state STS3C stops communications of clock signals except the clock signals communicated between the memory system 3 and the host device 2.

The transitioning states STS2A to STS2C include a plurality of states STS21A to STS24A, STS21B to STS24B, and STS21C to STS24C, respectively. The states STS21A to STS24A, STS21B to STS24B, and STS21C to STS24C are the same as the states STS21 to STS24 shown in FIG. 23; therefore description thereof will be omitted. The conditions of entry into the transitioning states STS2A to STS2C are different from each other. Namely, the memory controller 30 determines whether or not the correction amount calculation processing included in each of the transitioning states STS2A to STS2C can be executed using conditions different from each other.

The frequency of occurrence of the transition to the standby state in the memory system 3 becomes higher in the order of, for example, the standby A state STS3A, the standby B state STS3B, and the standby C state STS3C. Therefore, the frequency of the correction amount calculation processing becomes higher in the order of a case where the correction amount calculation processing is executed in the transitioning-between-active-and-standby A state STS2A, a case where the correction amount calculation processing is executed in the transitioning-between-active-and-standby B state STS2B, and a case where the correction amount calculation processing is executed in the transitioning-between-active-and-standby C state STS2C.

In the fifth embodiment, the difference in the frequency of occurrence of the transition to the standby state described above and the difference in the frequency of execution of the correction amount calculation processing for each physical block PBLK shown in FIG. 25 are associated with each other. Namely, the memory controller 30 calculates the amount of correction of the physical blocks PBLK grouped in the uncorrected list in the correction amount calculation processing executed in the transitioning-between-active-and-standby C state STS2C. The memory controller 30 calculates the amount of correction of the physical blocks PBLK grouped in the small-number-of-corrections list in the correction amount calculation processing executed in the transitioning-between-active-and-standby B state STS2B. The memory controller 30 calculates the amount of correction of the physical blocks PBLK grouped in the large-number-of-corrections list in the correction amount calculation processing executed in the transitioning-between-active-and-standby A state STS2A. Through the above process, the operation of differentiating the frequency of occurrence of the correction amount calculation processing for each physical block PBLK can be implemented.

5.4. Processing of Changing Correction Frequency

FIG. 28 is a flowchart showing an example of processing of changing the correction frequency of the memory system according to the fifth embodiment. In the example shown in FIG. 28, the condition of starting the processing of changing the correction frequency is that the correction amount calculation processing is completed.

As shown in FIG. 28, when the correction amount calculation processing is completed (Start), the memory controller 30 refers to the memory management information 22. The memory controller 30 then increments the number of corrections in a row corresponding to a correction target physical block PBLK (S71).

The memory controller 30 determines whether or not the number of corrections corresponding to the correction target is 1 (S72). If the number of corrections corresponding to the correction target is 1 (S72; yes), the memory controller 30 determines that the correction target physical block PBLK is grouped in the uncorrected list. The memory controller 30 then increments the pointer ptr1 in the uncorrected list (S73).

After the processing of S73, the memory controller 30 moves a row corresponding to a correction target physical block PBLK from the uncorrected list to a row immediately before a row pointed to by the pointer ptr2 in the small-number-of-corrections list (S74). Thus, the memory controller 30 can execute the next correction amount calculation processing on the physical block PBLK that has been subjected to the correction amount calculation processing, lastly in the current small-number-of-corrections list. When the processing of S74 is completed, the processing of changing the correction frequency will be finished (End).

If the number of corrections corresponding to the correction target is not 1 (S72; no), the memory controller 30 determines that the correction target physical block PBLK is grouped in the small-number-of-corrections list or the large-number-of-corrections list. Then, the memory controller 30 determines whether or not the number of corrections corresponding to the correction target is equal to or less than the threshold X (S75).

If the number of corrections corresponding to the correction target is equal to or less than the threshold X (S75; yes), the memory controller 30 determines that the correction target physical block PBLK is grouped in the small-number-of-corrections list. The memory controller 30 then increments the pointer ptr2 in the small-number-of-corrections list (S76).

After the processing of S76, the memory controller 30 determines whether or not the number of corrections corresponding to the correction target is the threshold X (S77). If the number of corrections corresponding to the correction target is not the threshold X (i.e., when the number of corrections is 2 or more and less than the threshold X) (S77; no), the processing of changing the correction frequency will be finished (End).

If the number of corrections corresponding to the correction target is the threshold X (S77; yes), the memory controller 30 moves a row corresponding to a correction target physical block PBLK from the small-number-of-corrections list to a row immediately before a row pointed to by the pointer ptr3 in the large-number-of-corrections list (S78). Thus, the memory controller 30 can execute the next correction amount calculation processing on the physical block PBLK that has been subjected to the correction amount calculation processing, lastly in the current large-number-of-corrections list. When the processing of S78 is completed, the processing of changing the correction frequency will be finished (End).

If the number of corrections corresponding to the correction target exceeds the threshold X (S75; no), the memory controller 30 determines that the correction target physical block PBLK is grouped in the large-number-of-corrections list. The memory controller 30 then increments the pointer ptr3 in the large-number-of-corrections list (S79). When the processing of S79 is completed, the processing of changing the correction frequency will be finished (End).

5.5. Advantageous Effects of Fifth Embodiment

According to the fifth embodiment, when the condition for entry into the standby C state STS3C is satisfied, the memory controller 30 executes the correction amount calculation processing for the correction target blocks grouped in the uncorrected list. When the condition for entry into the standby B state STS3B is satisfied, the memory controller 30 executes the correction amount calculation processing for the correction target blocks grouped in the small-number-of-corrections list. When the condition for entry into the standby A state STS3A is satisfied, the memory controller 30 executes the correction amount calculation processing for the correction target blocks grouped in the large-number-of-corrections list. The condition for entry into the standby C state STS3C has the highest frequency of occurrence. The condition for entry into the standby A state STS3A has the lowest frequency of occurrence. The condition for entry into the standby B state STS3B has a frequency of occurrence between that of the condition for entry into the standby A state STS3A and the condition for entry into the standby C state STS3C. Thus, the frequency of executing the correction amount calculation processing can be increased for physical blocks PBLK with a smaller number of corrections. This makes it possible to promptly execute the correction amount calculation processing for a physical block PBLK whose correction amount may be very far away from an optimal value, and also possible to reduce the number of executions of the correction amount calculation processing for a physical block PBLK whose correction amount may be very close to an appropriate value.

In the fifth embodiment, a case where the difference in the frequency of occurrence of the state transition and the difference in the frequency of execution of the correction amount calculation processing are associated with each other has been described; however, the embodiment is not limited thereto. For example, in the first embodiment, the number of host read requests to a representative cell unit CU may be taken into consideration as the condition for executing the correction amount calculation processing. Specifically, a control may be considered that sets the number of host read requests to a representative cell unit CU to 1 when it is desired to execute the correction amount calculation processing at a high frequency, and sets the number of host read requests to a representative cell unit CU to 5 when it is desired to execute the correction amount calculation processing at a low frequency.

6. Other Notes

The first to fifth embodiments described above are not limited to the examples shown above, and various modifications can be made thereto.

For example, in the above first to fifth embodiments, a case where a set including a single representative cell unit CU and a single representative correction amount ΔVa is allocated to a single physical block PBLK is described; however, the embodiments are not limited thereto. For example, multiple sets including a representative cell unit CU and a representative correction amount ΔVa may be allocated to a single physical block PBLK.

Also, in the above first to fifth embodiments, a case where two-bit data can be stored in a single memory cell transistor MT is described; however, the embodiments are not limited thereto. For example, cases where three-, four-, five-bits and greater data can be stored are also applicable.

While certain embodiments have been described, these embodiments have been presented by way of example only, and are not intended to limit the scope of the inventions. Indeed, the embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit.

What is claimed is:

1. A memory system, comprising:
a non-volatile memory including a plurality of groups, each of the plurality of groups including a plurality of cell units, each of the plurality of cell units including a plurality of memory cells; and
a memory controller configured to control the non-volatile memory, wherein
the memory controller is configured to execute a first operation, the first operation including:
based on a first correction amount associated with a target group, reading data from the target group;
executing error correction on the read data;
calculating a second correction amount based on the read data and the read data after the error correction; and
updating the first correction amount to the second correction amount,
the memory controller is configured to select a first group of the plurality of groups as the target group, and
in response to a read request specifying a logical address corresponding to a first cell unit included in the first group, the memory controller is further configured to read data from the first cell unit based on the first correction amount,
execute the error correction on the read data from the first cell unit, and
calculate the second correction amount based on the read data from the first cell unit and the read data from the first cell unit after the error correction.

2. The memory system according to claim 1, wherein in response to a read request specifying a logical address corresponding to a second cell unit included in the first group, the second cell unit being different from the first cell unit, the memory controller is further configured to;
calculate a third correction amount based on the first correction amount,
read data from the second cell unit based on the calculated third correction amount,
execute the error correction on the read data from the second cell unit,
calculate a fourth correction amount based on the read data from the second cell unit and the read data from the second cell unit after the error correction, and
calculate the second correction amount based on the fourth correction amount.

3. The memory system according to claim 1, wherein the memory controller is further configured to select a second group as the target group after performing the first operation related to the first group when a condition is satisfied.

4. The memory system according to claim 3, wherein the condition includes a number of requests received from a host device being equal to or greater than a first threshold.

5. The memory system according to claim 3, wherein the condition includes the memory system starting to transition from a first state to a second state.

6. The memory system according to claim 5, wherein:
the first state is an active state; and
the second state is a standby state.

7. The memory system according to claim 5, wherein:
the first state is an active state; and
the second state is a power-off state.

8. The memory system according to claim 3,
wherein satisfying the condition includes satisfying a first condition or a second condition, and
wherein the memory controller is further configured to:
in a case where the first condition is satisfied when the first group is selected as the target group, select the second group as the target group after performing the first operation related to the first group, and
in a case where the second condition is satisfied when a third group is selected as the target group, select a fourth group as the target group after performing the first operation related to the third group.

9. The memory system according to claim 8, wherein when a number of times the first operation related to the first group is executed is equal to or greater than a second threshold, the memory controller is further configured to change a condition for executing the first operation related to the first group from the first condition to the second condition.

10. The memory system according to claim 8, wherein:
the first condition includes the memory system starting to transition from a first state to a second state; and
the second condition includes the memory system starting to transition from the first state to a third state.

11. The memory system according to claim 10, wherein:
the first state is an active state;
the second state is a first standby state; and
the third state is a second standby state in which a frequency of occurrence is lower than that in the first standby state.

12. The memory system according to claim 11, wherein when a number of times the first operation related to the first group is executed is equal to or greater than a second threshold, the memory controller is further configured to change a condition for executing the first operation related to the first group from the first condition to the second condition.

13. The memory system according to claim 1, wherein each of the plurality of groups is a unit for erasing data.

14. The memory system according to claim 13, wherein each of the plurality of cell units is a unit for writing data.

15. The memory system according to claim 14, wherein the plurality of memory cells in a single cell unit among the plurality of cell units are commonly connected to a same word line, and respectively connected to different bit lines.

16. A memory system, comprising:
a non-volatile memory including a plurality of groups, each of the plurality of groups including a plurality of cell units, each of the plurality of cell units including a plurality of memory cells; and
a memory controller configured to control the non-volatile memory, wherein
the memory controller is configured to execute a first operation, the first operation including:
based on a first correction amount associated with a target group, reading data from the target group;
executing error correction on the read data;
calculating a second correction amount based on the read data and the read data after the error correction; and
updating the first correction amount to the second correction amount,
the memory controller is configured to select a first group of the plurality of groups as the target group, the memory controller is further configured to select a second group as the target group after performing the first operation related to the first group when a condition is satisfied, and the condition includes a number of requests received from a host device being equal to or greater than a first threshold.

* * * * *